US008274082B2

(12) United States Patent
Ferrã De Paiva Martins et al.

(10) Patent No.: US 8,274,082 B2
(45) Date of Patent: Sep. 25, 2012

(54) ELECTRONIC SEMICONDUCTOR DEVICE BASED ON COPPER NICKEL AND GALLIUM-TIN-ZINC-COPPER-TITANIUM P AND N-TYPE OXIDES, THEIR APPLICATIONS AND CORRESPONDING MANUFACTURE PROCESS

(75) Inventors: Rodrigo Ferrã De Paiva Martins, Charneca Da Caparica (PT); Elvira Maria Correia Fortunato, Charneca Da Caparica (PT)

(73) Assignee: Universidade Nova de Lisboa, Lisbon (PT)

( * ) Notice: Subject to any disclaimer, the term of this patent is extended or adjusted under 35 U.S.C. 154(b) by 388 days.

(21) Appl. No.: 12/525,703

(22) PCT Filed: Feb. 5, 2007

(86) PCT No.: PCT/PT2007/000008
§ 371 (c)(1),
(2), (4) Date: Aug. 4, 2009

(87) PCT Pub. No.: WO2008/097117
PCT Pub. Date: Aug. 14, 2008

(65) Prior Publication Data
US 2010/0090216 A1     Apr. 15, 2010

(51) Int. Cl.
*H01L 29/04*     (2006.01)
*H01L 31/20*     (2006.01)
*H01L 31/036*    (2006.01)
*H01L 31/0376*   (2006.01)

(52) U.S. Cl. .................. 257/59; 257/43; 257/72

(58) Field of Classification Search .......... 257/59–72, 257/347–351, 192–195, E29.273, E29.247–252
See application file for complete search history.

(56) References Cited

U.S. PATENT DOCUMENTS
2006/0108636 A1*  5/2006  Sano et al. .............. 257/347
* cited by examiner

*Primary Examiner* — Cuong Q Nguyen
(74) *Attorney, Agent, or Firm* — Kenealy Vaidya LLP

(57) ABSTRACT

The present invention corresponds to the use of p and n-type oxide semiconductors based on copper nickel ($OCu_xNi_y$, with $0<x<3$; $0<y<3$) or multicomponent Gallium-Tin-Zinc-Copper-Titanium oxide, designated here after as GSZTCO, in different molar compositions, having an amorphous or crystalline structure and with the electrical characteristics of a donor or electron acceptor semiconductor, doped or not doped with impurities, such as, Zirconium or nickel or nitrogen, as a way to control the semiconductor electronic behaviour (valence); including the manufacture process at room temperature or temperatures below 100° C. and their applications in optoelectronic and electronic fields is to manufacture devices, such as, Complementary-Metal-Oxide-Semiconductors, thin film transistors, pn heterojunctions, logic gates, O-ring oscillators, using as substrate glass, metal foils, polymers or cellulose materials, in which a protection layer based on magnesium fluoride is used, together with a tantalum oxide matching layer of the active semiconductors to a dielectric, such as, silicon dioxide.

15 Claims, 6 Drawing Sheets

US 8,274,082 B2

ELECTRONIC SEMICONDUCTOR DEVICE BASED ON COPPER NICKEL AND GALLIUM-TIN-ZINC-COPPER-TITANIUM P AND N-TYPE OXIDES, THEIR APPLICATIONS AND CORRESPONDING MANUFACTURE PROCESS

This application is a U.S. national phase filing under 35 U.S.C. §371 of PCT Application No. PCT/PT2007/000008, filed Feb. 5, 2007, the entire disclosure of which being incorporated herein.

FIELD OF INVENTION

The present invent is related to the use of p and n-type oxide semiconductors of copper and nickel ($OCu_xNi_y$ with $0<x<3$; $0<y<3$) or multicomponent Gallium-Tin-Zinc-Copper-Titanium, hereafter designated by GSZCTO in different component compositions, having an amorphous or crystalline structure and with the electrical characteristics of a donor (designated by n-type) or electron acceptor (designated by p-type) semiconductor, doped or not doped with impurities such as Zirconium or nickel or nitrogen, as a way to control of the semiconductor electronic behaviour (valence), including the fabrication process at room temperature or temperatures below 100° C. and their applications in optoelectronic and electronic fields to fabricate or produce devices such as Complementary-Metal-Oxide-Semiconductors, C-MOS (FIGS. 1-2), thin film transistors, TFT (FIGS. 3-5), p-n heterojunctions (FIG. 5), logic gates (FIG. 6), O-ring oscillators (FIG. 7), using as substrate glass, metal foils, polymers or cellulose materials and where a protection layer based on magnesium fluoride is used, together with a tantalum oxide matching layer of the active semiconductors to a dielectric such as silicon dioxide and can be used in the electronics industry, semi-conductor industry, display industry, logic circuits industry, instrumentation and sensor industry, medical and biotechnology industry, optoelectronics industry, solar cells and micro and nano-electronics industry.

Previewed of the Invention

The use of oxides in electronics and optoelectronics is well known, namely for their applications as a passive semiconductor, such as transparent and conductive electrode [1], or just as an anti-reflecting coating used in several optoelectronic or optical devices [2] including its deposition at room temperature [3,4]. However, its application as an active semiconductor material is mainly due to the initial work performed by H. Hosono [5], which was recently confirmed by its use in the fabrication of devices, namely thin film transistors, at low or high temperatures [6,7,8] and their transport properties have been explored, namely concerning the behaviour of amorphous oxides [9]. Moreover, we have been witness the use of active oxide semi-conductors in the manufacture of heterojunctions, namely light emitting diodes [10], and other luminescent applications [11], which have not been known till this day the full use of oxides in the manufacture of devices such as C-MOS.

As far the use of $OCu_xNi_y$ and of GSZCTO is concerned in different electronics applications this is unknown. Up to now it has been reported the use of conductive oxides of different compositions, normally in binary form and n-type, as it is referred in the US2006152138,patent where it is referred its use of oxides as a conductive electrode, namely the use of indium and tin oxides and of gallium zinc oxides to coat phosphorous nanoparticles, applications which are not connected or are based in the same materials compositions as the ones envisaged by the present patent, for instance, concerning the use of GSZTCO as an active or passive semiconductor, the same happening for the copper tin oxides included in this patent.

The patent US2006073092, referrers for instance to the pyrogenic preparation of zinc powder containing at least as a doping element one of the following elements/materials: aluminium, gallium, indium, germanium, tin, in percentages which vary between 0.005 to 15 at %, where the oxide zinc particles can also be aggregated with diameters between 300 and 400 nm. That is, this patent is more related to bulk ceramic materials syntherisation, nothing related to the resent invention.

The patent JP2006002202 has to do with the previous one, since it concerns the manufacture of ceramic targets by syntherisation of powders to be used in sputtering systems, using multiple mixtures of oxides that contain silicon, titanium, zinc, gallium, germanium, niobium, molybdenum, ruthenium, tin and tungsten, nothing related with the present invention, besides the eventual use of some of these targets for the conception of thin films stoichiometrical different of the original targets.

The patent GB1293408 referrers to the epitaxial growing of n-type indium oxide doped with gallium and aluminium to make a p-n type junction in a gallium arsenide substrate in order to make an p-n like heterojunctions to be used in applications such as light emitting diodes or lasers, whose goals have nothing to do with the present event r they even do not refer to the new semiconductor oxide alloys proposed in this event.

The patent WO2005081055, referrers to the manufacture of a double transparent and conductive films for applications in liquid crystal displays or organic light emitting diodes, respectively designated by LCD and OLED, besides to plasma displays, and ELD, including solar cells and other optoelectronic devices in which one of the layers is based on zinc oxide aluminium doped (AZO) or zinc oxide gallium doped GZO or zinc oxide Gallium and aluminium doped (AGZO) and the layer based on oxide highly etching selective , such as indium oxide tin doped (ITO), aiming to be used as a passive oxide semiconductor, that is as an electrode, a secondary application of the materials presented in this patent, including the p-type oxides. That is, this patent does not include any of the oxide semiconductors claimed in this patent but targets one of the possible applications of this invention, substituting in a positive way the present oxide materials based on high expensive indium. Therefore this patent is nothing to do with the claims of the patent now submitted.

The patent US2004178725 referrers to the use of tandem oxide based thin film structures to be used as optical reflectors, namely tandem structures having up to 4 stacked layers, constituted by titanium oxide, titanium nitre or oxides based on titanium and tungsten alloys plus alloys based on indium tin oxides, or zinc gallium oxides, not including nor the materials and nor the applications claimed in the present patent.

The patent JP2003324206 referrers to the manufacture of p-n junctions for photovoltaic applications in which the p-type is based on copper-aluminium oxide, copper-gallium oxide, indium-copper oxide and strontium-copper oxide, while the n-type semiconductor layer is selected from one of the following oxides: tin oxide, indium oxide, titanium oxide, gallium oxide, or from gallium nitride, different materials compositions from the ones claimed in the present invention that includes the manufacture of C-MOS and TFT devices, besides p-n homojunctions and heterojunctions devices.

The patent US2002028571, referrers to a new zinc oxide alloy incorporating gallium and hydrogen, obtained by co-deposition and processed at low temperatures to be used as transparent electrodes, not included in the claims of the present invention.

The patent U.S. Pat. No. 6,391,462, referrers to thin films that can be used as optical filters and/or bathers to the impurity diffusion and are constituted by zinc oxide, titanium oxide, indium oxide, tin oxide and cadmium oxide, doped or not doped with gallium, aluminium, tin, antimony and silver, materials and applications not included in the claims of the present invention.

The patent JP2000045063 referrers to the formation of transparent and conductive oxides indium based and containing tin, zinc or gallium with thicknesses between 50 nm and 500 nm to be deposited on polymeric substrates as electrodes, on single or tandem structures. Although it also considers the low temperature deposition process, this patent does not include the main objective of the present invention demands.

The patent JP6338223 aims to develop transparent electrodes to be used on solar cells that can be corrosion resistant, namely oxides zinc based doped with gallium, as ohmic electrode in single or laminated staked structures, not including the objectives and claims o the present invention.

The patent JP4367540 referrers to the manufacture of transparent and photo-conductive thin films by lamination of two species of metallic oxides, selected among zinc oxide, gallium oxide, indium oxide, and tin oxide, deposited in ceramic or glass substrates to be used as optical sensors, solar cells and other optoelectronic devices, not involving any of the main objectives of the present invention.

The patent US2002135324 referrers to the use of MgF composites in insulating arc discharge lamp systems, not involving so the use of $MgF_x$, where x varies between 1 and 2, as encapsulating or passivating material for electronic devices.

The patent US2006204766 referrers also to the use of $MgF_2$ as an anti-humidity and anti-repellent film, namely to functionalize polymeric materials for different applications, including the ophthalmic ones, applications not included in the claims of the present invention.

The patent US20060202610 A1 referrers to the use multi-layer structures (up to 4) as anti-reflecting and transparent electrodes to be used namely in flat displays, using materials such as titanium nitride, or titanium tungsten alloys, and/or indium oxide, and/or indium tin oxide, and/or indium zinc oxides, or zinc gallium oxides, including also similar electronic applications as the ones of the present invention but not including any of the materials or structures claimed in the present invention demand.

The patent US 1999/5,910,218 referrers to the use of materials of high dielectric constant to be used as dielectric materials or insulating materials in electronics, such as capacitors, where it is also included the use of pentoxide tantalum, not including the use of this materials as a matching material between two semiconductors or between an oxide semiconductor and a dielectric, as claimed in the objectives of the present invention demand.

The same happens with the patent JP3041643, in which the tantalum pentoxide is used in the stoichiometric form($Ta_2O_5$) as a dielectric layer in information recording processes by another electronic material. In the present patent it is also referred to its fabrication process through RF sputtering.

Besides the set of patent mentioned before, the applications of active semi-conductors, namely in thin film transistors are known the applications concerning zinc oxide [7], indium doped with zinc [8], zinc doped with tin [12], to the gallium-zinc-indium-oxygen alloys [5,13], for which are known already patents namely connected to Dupont and Hewlett Packard companies in USA and Canon in Japan. It is not known any patent connected to the use and manufacture of $OCu_xNi_y$, or amorphous or crystalline GSZCTO and/or their possible doping set of films, including the low temperature process. In this field following patents are known:

The patent WO2004/038757 (J. Wager/ Oregon State University), concerns the use of materials such as zinc oxide, (ZnO), tin oxide ($SnO_2$) or indium oxide ($In_2O_3$) as an active semiconductor (manufacture of the channel region of thin film transistors) involving as dielectric any insulating material, not involving any protection layer or matching layer to the dielectric, not covering so any of relevant claims of the present invention. On the other hand, it is emphasising in this patent the fabrication process that takes place at high temperatures.

The patent US2003/0218221A1, corresponds to the patent WO2004/038757, and so, as already stated, different of the present patent. Nevertheless we should notice the emphasis given only to ZnO or $SnO_2$ and the possibility to use other additives to these oxides of the periodic table such as Al, In, Ga, Bi, B, La, Sc, Y, Lu, Er, as well as to the temperature process that takes place in the temperature range from 500 to 1000 Centigrade degrees.

The patent US2005/0017244A1 (Hewllet Packard) deals with the use as active semiconductor, namely for applications as thin film transistors of zinc tin oxides where it is not emphasised the process temperature or it is not indicated other relevant patent element that could collide with the objective of the present invention demand.

The patent US2005/0199959 A1 (J. Wager e Oregon State University, OSU) referrers to the use as active semiconductor of zinc indium oxide alloys, for different electronic applications, including thin film transistors, not colliding so with the objectives of the present invention demands.

The patent US2006/0079034 A1 (J. Wager e OSU) concerns the application as passivating layer in electronic circuits, namely thin film transistors of a layer based on $SiO_x$, $SiN_x$, $SiO_xN_y$, $GeO_xTaO_xSiO_xC_y$, $YO_x$, $Mg_x$ and other materials, not coincide so with the main claims of the present demand invention.

The patent WO2005/088726 A1, (H. Hosono)referrers to the manufacture of thin film transistors based on amorphous oxides where the materials used to fabricate the channel has an electron concentration below $10^{18}/cm^3$, whose control of the materials performances is performed by controlling the oxygen partial pressure during the deposition process. The materials in which the oxides are based consists in Ga—In—Zn; In—Ga—$Zn_{1-x}$—$Mg_x$, or Ga—Zn—Sn alloys that constitute the basis of the ceramic targets used and the manufacture process can be performed at temperatures as high 1000° C., supplying as example of the fabrication technique the Pulsed Laser Deposition(PLD) technique and in their claims are considered the following compositions: $In_xGa_{1-x}$ ($0 \leq x \leq 1$), $In_xZn_{1-x}$($0.2 \leq x \leq 1$), $In_xSn_{1-x}$($0.8 \leq x \leq 1$), $In_x$(Zn, Sn)$_{1-x}$ ($0.15 \leq x \leq 1$) or multicomposites of the type [($Sn_{1-x}$ $M4_x$)$O_2$]a.[($In_{1-y}M3_y$)$_2°_3$]b.[($Zn_{1-z}M2_z$)O]c.[$0 \leq x \leq 1$, $0 \leq y \leq 1$, $0 \leq z \leq 1$, $0 \leq a \leq 0 \leq b1$, $0 \leq c \leq 1$], where it is also mentioned as M4 type impurities the Si, Ge, Zr, impurities of M3 type as B, Al, Ga, Y, impurities of M2 type as Mg and Ca, and impurities of M5 type as V, Nb, Ta. This patent although targeting similar electronic applications based on oxide materials, namely the n-type ones, does not include the compositions or the materials claimed in the present patent and do not include the p-type devices or the C-MOS devices included in the objectives of the present invention.

The patent JP2006165527A, is of the same inventors as the patent above and it corresponds to the upgraded of the previous one where it is included the low temperature processes as it is mentioned in the present invention. Nevertheless, it does not include the main objectives of the resent invention.

In terms of utilization of oxides in the manufacture of junctions, besides the works published, for instance by Hosono et al. as well as by the set of references already mentioned, nothing is known about the manufacture of p-n heterojunctions or junctions of $OCu_xNi_y$ and/or GSZCTO.

In terms of use of tantalum pentoxide as a matching layer between two oxide semi-conductors or between a semiconductor and an oxide, the research performed led us the use of this material mainly as dielectric. As revealed by JP3041643, where the material is applied in its stoichiometric composition($Ta_2O_5$) as dielectric layer in information recording applications through an electronic material. This patent also referrers to the fabrication method by RF sputtering. Nevertheless, nothing is known about its use as a matching layer.

Concerning the use of magnesium fluoride films it exists a patent claim its use as a passivating layer, but nothing is mentioned concerning its use as encapsulating material in electronic devices fully based on oxide semiconductors.

Concerning the use of crystalline silicon/oxide semiconductors heterojunctions are namely known the works concerning the manufacture of heterojunctions based on n-type crystalline silicon and indium tin oxide deposited by spray pyrolysis or by thermal evaporation a [14] (see also FIG. 8) or by sputtering [15,16], (see FIG. 9) or of heterojunctions constituted by crystalline silicon, plus an amorphous intrinsic silicon film, followed by the deposition of two oxide layers, one to give rise to the junction and another to make the front ohmic and transparent contact. This is the case of the fabrication process developed by Sanyo [17]. Nevertheless this process differs from the one claimed in the present invention once it is not considered the use of multi component oxides of different types, which it is one of the main objectives claimed in the present invention.

Applications

The main industries that can come to use the GSZTCO and the $OCu_xNi_y$ are all electronic industries, the semiconductor industry, the display industry, the logic circuit industry, the sensor and instrumentation industry, the medical and biotechnology industry the optoelectronic and solar cells industry, the micro and nanoelectronic industry, namely where $OCu_xNi_y$ and GSZTCO can be used in the conception of CMOS devices where there the $OCu_xNi_y$ constitute the p-type transistor component and the GSZTCO constitute the n-type transistor component, for direct application in all electronics as a substitute of the conventional semiconductors, or can be used to produce TFT for switching applications, including or not their use in the manufacture of drivers for active matrices to address Liquid Crystal Displays (LCD) or organic light emitting diodes displays (OLEDs); conception of logic circuits, namely inverters, AND, OR logic gates, NAND and NOR logic gates; O-Ring oscillators, to fabricate heterojunctions namely rectifying diodes, LED, photovoltaic devices and others; in the instrumentation industry, namely as UV and or gas sensor; in the medical and/or food industry as a switching key of control and alarm circuits; military defense industry to produce invisible displays.

The present invention has as objective to develop a product or products using easy and not expensive processing techniques that allow to replace the conventional materials used to fabricate TFT, namely covalent semiconductors such as amorphous silicon due to its low carrier mobility or even the crystalline silicon since this material can not be processed at low temperatures and globally since the materials proposed are environmental friendly, not including in their processes the hazard and potential dangerous steps typically of microelectronics dealing with silicon, namely their we have to deal with high explosive and poison gases such as phosphine, diborane and silane, which require special operation condition, which does not happen with the materials and processes involved in the present invention.

Besides, the fabrication steps used in the present invention, are compatible with the existing fabrication steps in the electronic or optoelectronic or semiconductor industries, namely the sputtering techniques for large area processes or the thermal evaporation or the sol-gel, not needing so large investments concerning research and development concerning the matching of the laboratory technology processes to the industry since industries are already able to fabricate large area thin films based on passive oxide semiconductors to produce conductive and transparent electrical contacts.

Figure 1:
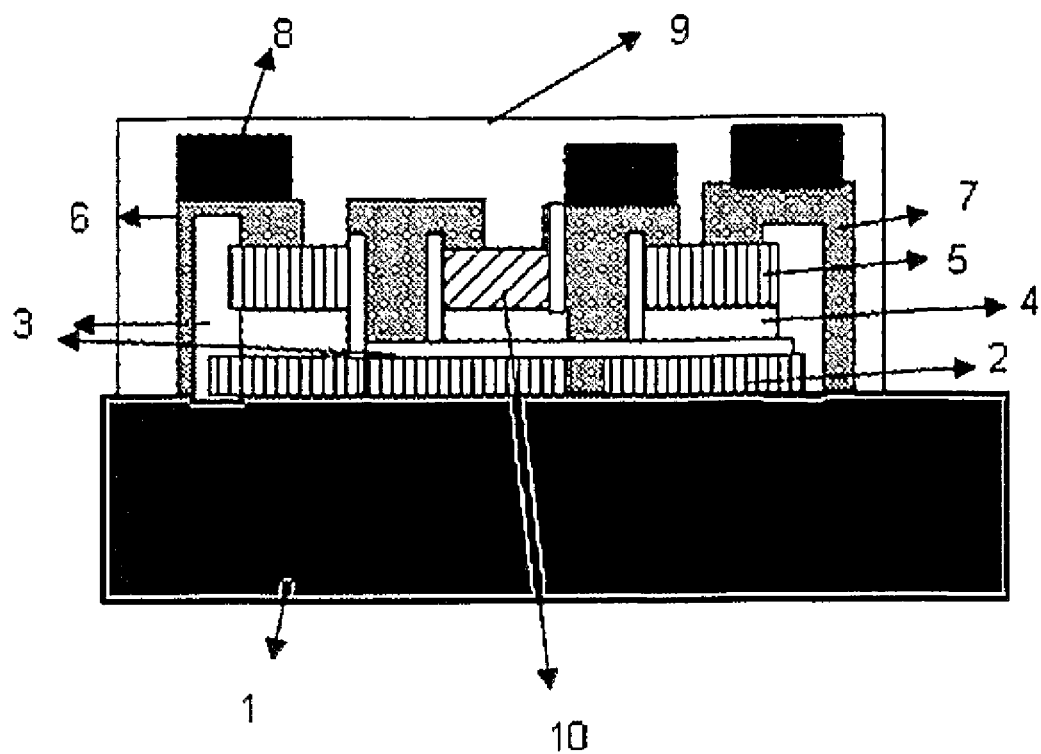
FIG. 1—Cross section view of an asymmetric CMOS device showing the channel, source, drain and dielectric regions, the matching layer from the dielectric to the oxide semiconductor used in the channel region, the metallic contacts, the encapsulating layer, resulting from the combination of an n-type TFT working in the enhancement mode as a driver and a p-type TFT working also in the enhancement mode, and behaving as a dynamic load, according to the legend:
1—Substrate
2—Gate electrode (metal or oxide highly conductive)
3—Dielectric (for instance, silicon dioxide or silicon nitride)
4—Matching layer of the dielectric-channel based on $Ta_xO_y$
5—Channel (n-type GSZTCO)
6—Source (Metal or IZO or ZGO or GSZO or GSZTCO of high conductive)
7—Drain/Source
8—External metal contact
9—$MgF_x$ encapsulating layer
10—Channels of the p-type transistor based on $OCu_xNi_y$ or doped GSZTCO.
Figure 2:
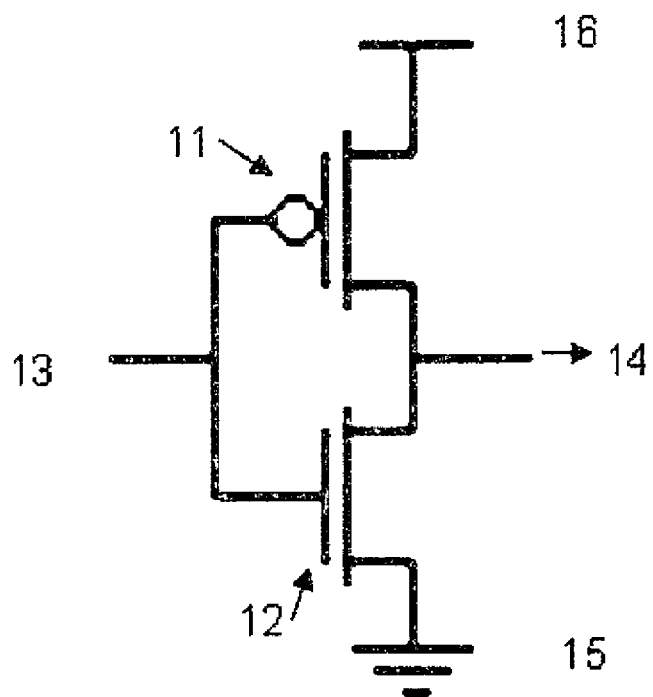
FIG. 2—Sketch of the same device depicted in FIG. 1 showing the two transistors, according to the legend:
11—p-type TFT Transistor
12—n-type TFT Transistor
13—Point of input voltage
14—Point of the output voltage
15—Reference voltage or ground
16—Applied biased voltage.

18—Electronic symbol of the inverter circuit shown in FIGS. 1 and 2.

Figure 8:
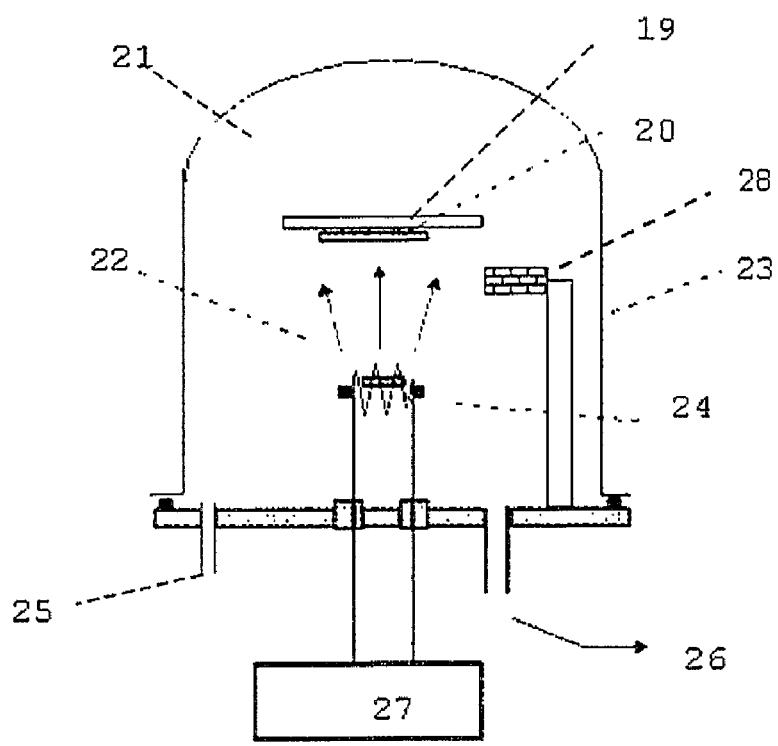

FIG. 8—Sketch of a thin film manufacture system by resistive thermal evaporation showing features of the process chamber according to comment numbers:

19—Substrate holder
20—Substrate upon which the devices will be deposited
21—Inside view of the chamber under a vacuum pressure in the range of $10^{-3}$- 1e Pa, with or without the presence of an inert gas like Argon, according to the comment numbers:
22—Flow of the evaporating material
23—Process chamber
24—Heating resistance element/boat that contains the material to be evaporated
25—Gas inlet (oxygen, argon, hydrogen, nitrogen, . . . ) to the process chamber
26—Chamber disposal system outlet
27—Power supply (energy, W) of the boat that contains the material to be evaporated
28—UV light source to assist the deposition process.

Figure 9:
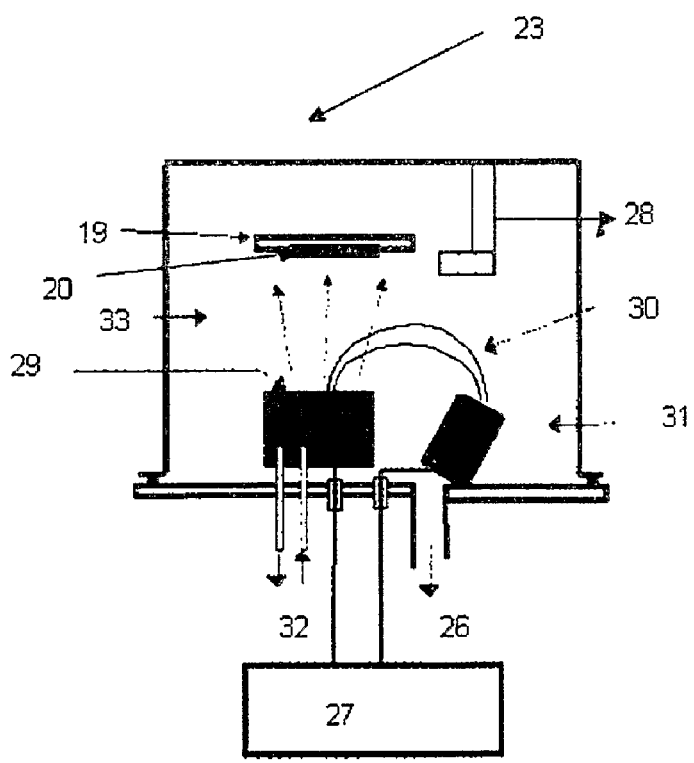

FIG. 9—Sketch of a thermal evaporation system by electron gun showing the details of the system according to the comment numbers:

29—Boat that contains the material to be evaporated
30—Focus of the electron beam
31—Electron beam (source of electrons)
32—Water Cooling system of the system that contains the boat
33—Evaporating beam flow.

Figure 10:
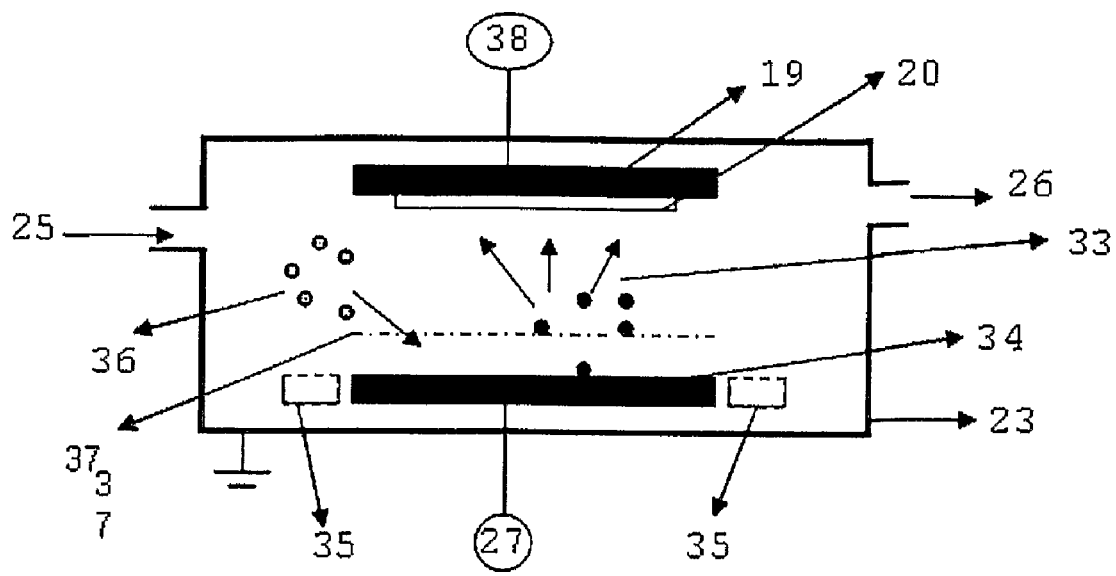

FIG. 10—Sketch of a sputtering system used to process the present thin films, according to the comment numbers:

34—Electrode where it is applied a dc or RF electrical power sign that contains the target (cathode) and that can be surround or containing below a confinement magnetic field
35—Injector of reactive or sputtered gas such as argon placed close the target region and made of a non conductor material
36—Ionized gas species such as argon
37—Bias net/mesh
38—Substrate bias.

Figure 11:
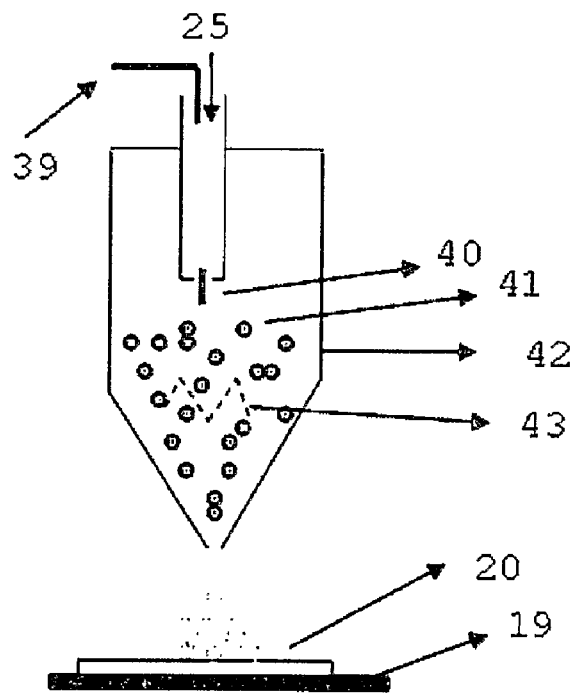

FIG. 11—Thin film deposition system by ink-jet according to the legend numbers:

39—Inlet of the inert gas that will pressure chemical solution towards an atomizer
40—Atomizer
41—Nano-drops of the atomized solutions
42—Container of the ink-jet system that contains the atomizer, the chemical solution to be controlled atomized upon a substrate and the heating system
43—Heating resistance/bias.

Figure 12:
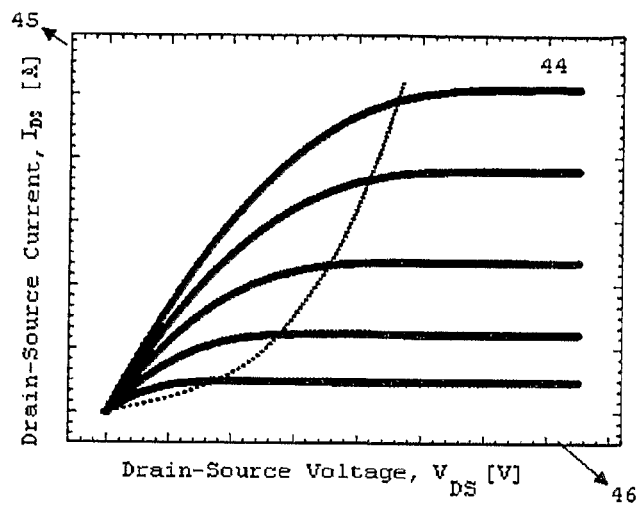

FIG. 12—representation of the output characteristic curve (drain current versus drain-source voltage using as a parameter the gate voltage) of an n-type GSZTCO TFT according to the comment numbers:

44—Parameterized curves as a function of the gate voltage used, in steps of 2 V per curve, starting at 5V 45—Drain current scale where each major division corresponds to $0{,}5'10^{-3}$ A, and the origin is 0 A
46—Drain-source voltage scale which major division corresponds to 2 Volts and the origin is 0 Volts.

Figure 13:
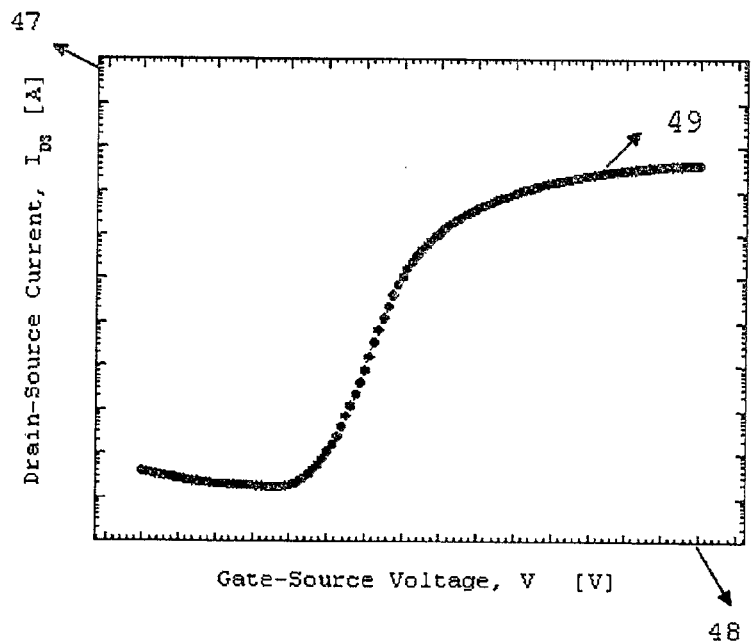

FIG. 13—Transfer curve of the drain-source current as a function of the gate-source voltage for a fixed drain voltage of 10 Volts of the same device as the one represented in FIG. 12, according to the comments:

47—Drain current scale wherein each major division corresponds to a decade with the origin at $10^{12}$ A
48—Gate-source voltage scale wherein each major division corresponds to 2 Volts, with the origin at −12 Volts
49—Representation of the transfer curve whereupon the ratio between the two flat regions corresponding to the largest and the smallest current is $2{,}3'10^7$, the voltage corresponding to the transition of the off-state to the on-state is 0 Volts and saturation mobility is 48,5 $cm^2V^{-1}s^{-1}$.

Figure 14:
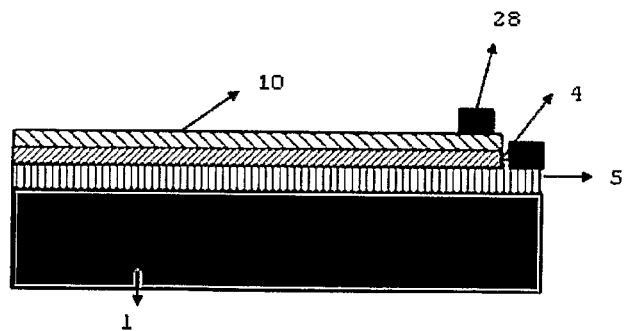

FIG. 14—Cross section sketch of a pn junction based on n-type GSZTCO and p-type $OCu_xNi_y$ according to the comment numbers.

SUMMARY OF THE INVENTION

The present invention is related to the use of multicomponent oxides having in their composition Copper and Nickel or Gallium, Tin, Zinc, Titanium, Copper, designated as $OCu_xNi_y$ and GSZTCO in the non-stoichiometric or stoichiometric form, where the amount of each element that composes the multicomponent oxide can vary 'between' 0,005 to 0,995, that determines the optical and electronical functionalities of the final material manufactured or by adding other impurities, such as, Zirconium or Nitrogen in amounts that can go up to 0.20 of the total composition and can even substitute one or two elements of the defined compositions in order to allow a better control of the electrical conductivity and the number of free carriers and their nature (electrons or holes, designated respectively by n-type and p-type), to be used in electronic and optoelectronic applications as a passive electronic material, for instance, in n-and p-type ohmic-like contacts or as n-type or p-type active electronic material, as for instance, to be one side of a p-n semiconductor junction (see FIG. 14), in heterojunctions or C-MOS like devices or as a channel material in devices, such as, thin film transistors, designated by TFT. In all cases the devices are processed at temperatures below 100° C. using device thicknesses in the range of 10-10000 nm, when the material is used in the passive form or as element of a p-n junction or thicknesses in the range of 1-1000 nm, when it is used as an active semiconductor like in the channel of a TFT and wherein it is used magnesium fluoride based material to encapsulate the final device and a pentoxide tantalum thin film to match the active semiconductor to the dielectric.

The new electronic materials designated by $OCu_xNi_y$ and GSZTCO, with different compositions, containing or not other impurities like Zirconium or Nitrogen, can be deposited in any type of substrate such as glass, polymer or cellulosic paper, at temperatures below 100° C. Being highly compact/dense, with controlled electrical between $10^{-14}$ S.cm$^{-1}$ to $10^5$ S.cm$^{-1}$; exhibiting a normal behaviour as p-type material, in the case of $OCu_xNi_y$ processed at temperatures 100° C. in the presence of a UV light source and n-type, in the case of GSZTCO, can also be converted to p-type by increasing the amount of copper present in the composition or by adding impurities like nitrogen that can substitute one of the elements presents in the GSZTCO composition, such as, Tin or Gallium whose substitution does not bring an enhancement of gaps or interstices in the material allowing a better control concerning the origin of the free carriers, by impurities and not by oxygen vacancies.

The new electronic materials designated as $OCu_xNi_y$ and GSZTCO, with different compositions, containing or not other impurities like Zirconium or Nitrogen, can be deposited in any type of substrate, such as, glass, polymer or cellulosic paper, using physics, chemical-physics or chemical like resistive thermal evaporation (see FIG. 8) or electron gun (see FIG. 9), sputtering (see FIG. 10) or ink-jet (see FIG. 11), with or without the presence of UV light in order to manufacture films with a controlled composition, amorphous or crystalline, like highly dense using growth rates between $0.01$ $nms^{-1}$ to $20$ $nms^{-1}$, function of the used energy power in the process, such as $0.1$ $Wcm^{-2}$ to $20$ $Wcm^{-2}$ and the source distance between the that contains the material to be deposited and substrate, for instance, 2 cm to 50 cm, from the used atmosphere, for instance argon mixed in different proportions with oxygen or nitrogen and/or hydrogen, using process pressures between $10^5$ Pa to $10^{-6}$ Pa, with oxygen partial pressures between 10 Pa to $10^{-5}$ Pa, with or without hydrogen or nitrogen or fluor in proportions that may go from 0.00 to 0.99 of the oxygen amount and that after the device is processed, they are heated and treated at temperatures that can vary between 50° C. to 250° C., type of substrate function used, during periods of time that can vary between 50 minutes to 6 hours.

The new electronic materials designated as $OCu_xNi_y$, when p-type and GSZTCO; when n-type can be used in the passive form as high conductivity electrode and when the active form can be used in the manufacture of p-n heterojunctions; as for instance $OCu_xNi_y$ and GSZTCO or in CMOS devices (see FIG. 1) or another, or in n-and p-types TFT with a geometric conventional symmetry (see FIGS. 3 and 4) or an asymmetric one (see FIG. 5) working in the enhancement (off-state without applied input voltage, as in the case of the devices depicted in FIGS. 12 and 13) or in the depletion modes (with current flow even when disconnected).

The new electronic materials designated as $OCu_xNi_y$ and GSZTCO, when n-type can be used to manufacture p-n heterojunctions, in which, the external contacts are made by depositing for instance in a covalent semiconductor like silicon and upon an active oxide semiconductor metal contacts, such as, aluminium, silver/aluminium, titanium-palladium-silver, tin-silver, gold/chromium, or another; through which an external circuit is connected and where the junction working mode is related to the capacity that it has of rectifying an applied electrical signal or to work as a photo-cell.

The new electronic materials designated as $OCu_xNi_y$ and GSZTCO, respectively p-type and n-type, can be combined to manufacture a C-MOS device (see FIGS. 1 e 2) or to manufacture logic circuits (see FIGS. 6 e 7), or sensor instruments or biodetectors where the encapsulating layer is based on magnesium fluoride.

The new electronic materials designated as $OCu_xNi_y$ and GSZTCO, when p-type or n-type can be used as active materials, respectively in p-type and n-type TFT channels, wherein the drain and source regions that behave simultaneously as external contacts are made by depositing aluminium, silver-aluminium, titanium-palladium-silver, tin-silver, gold/chromium or another; for instance, highly conductive oxide, such as, indium oxide doped with zinc or zinc oxide gallium doped (see FIGS. 3 to 5), where the device working mode consists of having a drain below $10^{-9}$ A when the device is disconnected; when the device is connected, by a suitable gate voltage application, the drain current increases at least six orders of magnitude and it is highly stable irrespective of the drain-source voltage used (always below the material breakdown voltage, see FIGS. 12 and 13).

The new electronic materials designated by $OCu_xNi_y$ and GSZTCO, when p-type or n-type can be used as active materials, respectively in p-type and n-type TFT channels, in which, the drain and source regions that behave simultaneously as external contacts are made by depositing aluminium, silver-aluminium, titanium-palladium-silver, tin-silver, gold/chromium or another, for instance, highly conductive oxide as indium oxide doped with zinc or zinc oxide gallium doped, wherein the needed voltage to make the n-type devices in the enhancement mode to change the state is 0-5 Volts and 0-(−)5V for p-type devices working in the enhancement mode. When the devices work in the depletion mode, the above values are therefore respectively negative for the n-type devices and positive for the p-type devices The new electronic material designated as GSZTCO, when p-type or n-type can be used as active material to manufacture p-type or n-type TFT channels or to manufacture p-n heterojunctions or C-MOS devices or logic gates or sensor instruments or biodetectors, in which, the stoichiometric or non-stoichiometric pentoxide tantalum layer is used to match GSZTCO to a dielectric as silicon dioxide; with or without heat treatment to temperatures up to 350° C. in a controlled atmosphere, function with the type of substrate used.

General Description of the Invention

The present invention is related to the use of $OCu_xNi_y$ and GSZTCO as active n-type and p-type semiconductor materials doped or not doped with other impurities like zirconium, or nitrogen; manufacture process at low temperatures with or without the presence of UV light and all peripheral inherent to their manufacture, in order to apply them in active devices, including the use of an encapsulating layer based on magnesium fluoride; the use of a tantalum pentoxide layer to match the active semi-conductor interface to a dielectric layer, namely in applications wherein the oxide active semiconductor is used in the TFT channel or to manufacture C-MOS or p-n heterojunctions, using just oxides or combining them with other semiconductors, such as, covalent semiconductors as p-and n-type silicon.

The electronic devices based on these materials such as C-MOS, TFT or p-n heterojunctions present the following advantages in comparison the conventional ones:
 The manufacture process of the transistor based devices or the p-n junctions takes place at room temperature or temperatures below 100° C.;
 The devices once manufactured may be annealed at a controlled atmosphere, normal temperatures and below 150° C., a value slightly lower than that value used to improve the metal contact ohmicity in semiconductors;
 In the case of heterojunctions, the transparent oxide semiconductor can be used simultaneously as an ohmic electrode contact and the active element of the junction, avoiding the need to use another step in their manufacture procedures, such as, an extra layer to be used as the transparent contact;
 Use either n-or p-type $OCu_xNi_y$ or GSZTCO as active layer (channel) when manufacturing TFT;
 Use, for instance, in the case of TFT, the tantalum pentoxide as a matching layer of the channel material in order to stabilize the device;
 Use a thin film to encapsulate the devices based on magnesium fluoride, in order to enhance the device stability especially in TFT;

The necessary equipments to the manufacture process are the same as the ones used today in the electronic and optoelectronic industry, in order to manufacture oxides, as it is done in the sputtering technique, which has been used to manufacture large scale devices, but now will be used to manufacture the materials of the present invention at low substrate temperatures;

Assure an identical or higher performance of the devices nowadays used in the manufacture of TFT, that is to say, in terms of comparison with the manufactured with TFT or p-n junctions;

Manufacture highly stable devices;

Manufacture fully transparent devices and logic gates, including C-MOS devices.

Thus, by using $OCu_xNi_y$ or GSZTCO films in their different compositions, including or not impurities, as already mentioned, as well as the use of an encapsulating coating of magnesium fluoride and a matching layer as tantalum pentoxide; the number of manufactering steps to manufacture electronic devices are reduced and devices with high performances can be manufactured, that is to say, for TFT presenting on/off ratios larger than $10^6$; On Voltages (to switch the TFT to the on-state) below 5 Volts for n-type transistors working in the enhancement mode, with leakage currents below $10^{-9}$ A, highly stable (above 90%) drain currents (they are kept constant independent of the drain-source voltage applied, only for values above the voltage to connect the TFT; saturation mobility's (open channel) above 5 $Vcm^{-2}s^{-1}$, stability above 10%, that is: hysteresis in the tensio transfer curves relating the input voltage (gate voltage) and the output current (drain-source current), using as parameter the drain-source voltage; firstly the instability due to the connecting and disconnecting of the device, secondly the device behaviour after being kept connected for longer then 1000 hours, is negligible. In addition to that, these materials allow to manufacture logic circuits fully bases on oxides with the functionalities required by the industry, namely, working frequencies above 300 kHz, as it is the case of the O-Ring oscillator circuits.

The manufacture process of the materials mentioned above, namely $OCu_xNi_y$, the GSZTCO, the magnesium fluoride and the tantalum pentoxide in their amorphous or crystalline structures, stoichiometric or not, are based in chemical, physics or physical-chemical techniques such as resistive or electron gun thermal evaporation (see FIGS. 8 and 9, dc or rf sputtering, assisted or not by a magnetic field (see FIG. 10); or by ink-jet (see FIG. 11), with or without the presence of a UV light to assist all the deposition process.

The above mentioned techniques are also used to manufacture other materials and structures, such as, to manufacture the metallic contacts and the dielectrics in unipolar transistors; these tools are necessary to manufacture the materials and devices claimed in this invention such as TFT, or heterojunctions or logic gates or C-MOS circuits.

The manufacture process temperatures, used to manufacture the materials and devices claimed in this invention, vary between 20° C. and 100° C., the desired device function's design and of the type of substrate used.

In conformity with the above, the $OCu_xNi_y$ and the GSZTCO can be manufactured in any type of substrate, namely glass, polymer, metal or cellulosic paper.

To take out the electrical signal of the devices manufactured, using $OCu_xNi_y$ and/or GSZTCO, it is done by using a metal electrode contacts show very high conductivity, such as, Cr or Ag, connected or not to high transparent and conductive oxide amorphous or crystalline films (charge collector) such as zinc oxide gallium doped, ZGO, or indium oxide zinc doped, IZO.

In conformity with the above, the devices based on $OCu_x$-$Ni_y$ and/or GSZTCO in their different compositions, including or not other impurities, as well as, one encapsulating layer based on magnesium fluoride, and in one matching layer based on tantalum pentoxide; can be reheated or not in a controlled post-manufacture atmosphere of temperatures that go up to 250° C.; using times that vary between 50 minutes to 6 hours, the substrate function type used and the type of device manufactered.

In conformity with the above, the devices based on $OCu_x$-$Ni_y$ and/or GSZTCO, in their different compositions, including or not other impurities as already mentioned, p-type or n-type, when used in the conception of the TFT channels, in micro or nanodevices exhibiting thicknesses that vary between 1 nm and 1000 nm.

In conformity with the above, the devices based on $OCu_x$-$Ni_y$ and/or GSZTCO in their different compositions, including or not other impurities as already mentioned n-type or p-type, when used in the conception of TFT as channel layer display the thicknesses above referred and using as matching layer of the active oxide film to the dielectric, for instance silicon dioxide or silicon nitride, a tantalum pentoxide film with thicknesses ranging from 1 nm to 1000 nm.

In conformity with the above, the devices based on $OCu_x$-$Ni_y$ and/or GSZTCO usage, in their different compositions, including or not other impurities as mentioned before n-type or p-type, when used in the conception of TFT as channel layer, displaying the thicknesses above referred and are used as matching layer of the active dielectric oxide film conductor, a tantalum pentoxide film and an encapsulating film based on magnesium fluoride with thicknesses ranging from 10 nm to 1000 nm.

In conformity with the above , the devices based on $OCu_x$-$Ni_y$ and/or GSZTCO in their different compositions, including or not other impurities as already mentioned n-type or p-type, when used in the conception of p-n heterojunctions or C-MOS devices, the n-type and/or the p-type layers have thicknesses that vary between 5 nm to 10000 nm, the characteristic function of the semiconductor, to which, the oxide semi-conductor will be connected, in cases where there is simultaneous use of both oxides to make a junction the thickest oxide, it corresponds to the material with less free carriers, for instance, with the same performances as the material used to manufacture the channel layer in TFT; the thinnest oxide has a thickness of about one order of magnitude, thinner than the thicker oxide; but with having free carriers with more than one to two orders of magnitude than the previous oxide, such as the oxides used to manufacture electric contacts, and designated by passive semiconductors.

In conformity with the above, the devices based on $OCu_x$-$Ni_y$ and/or GSZTCO in their varied compositions, including or not other previously mentioned impurities n-type or p-type, as well as when it is used a tantalum pentoxide matching layer of the active oxide to the dielectric semiconductor, as well as when a magnesium fluoride encapsulating layer is used; the end device where these materials are included, as well as, others like the metal electrodes and the dielectrics may or may not undertake a thermal treatment in a controlled atmosphere using temperatures and times that depend on the type of device manufactured; and of the substrate used where the temperatures may vary between 50° C. and 350° C., with times that vary between 50 minutes to 6 hours.

DETAILED DESCRIPTION OF THE INVENTION

Figure 3:
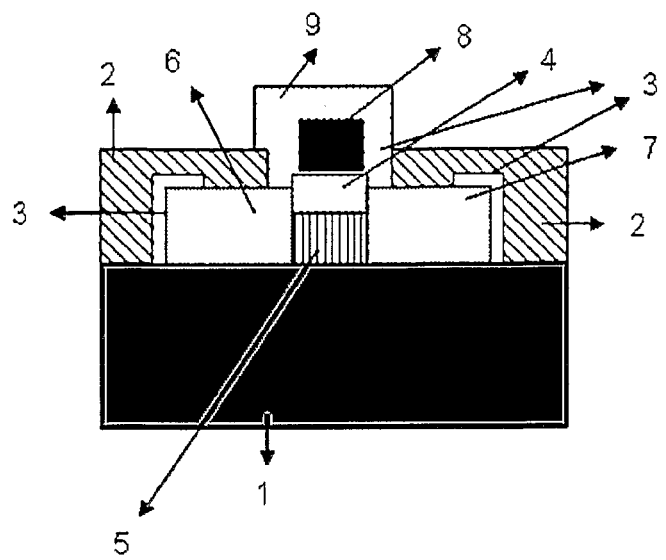
FIG. 3—Cross section view of a staggered symmetric showing the TFT showing the channel, source, drain and dielectric regions, the matching layer from the dielectric to the oxide semiconductor used in the channel region, the metallic contacts, the encapsulating layer according to the comment numbers.
Figure 4:
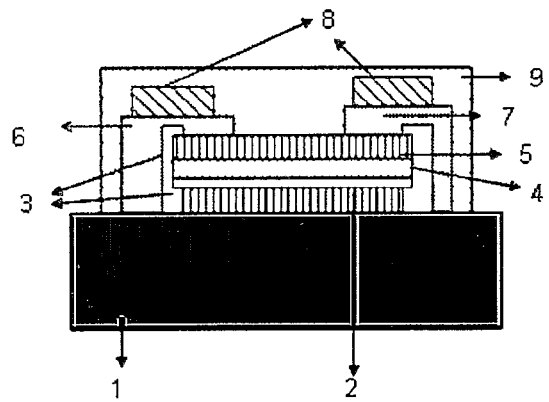
FIG. 4—Cross section view of non-staggered asymmetric showing the TFT showing the channel, source, drain and dielectric regions, the matching layer from the dielectric to the oxide semiconductor used in the channel region, the metallic contacts, the encapsulating layer according to the comment numbers.

As previously referred, the main components of the invention are the $OCu_xN_y$, see FIGS. 1 and 14, (10), and the GSZ- TCO, see FIGS. 3, 4 and 14 (4), in their different compositions, including or not impurities, such as, zirconium or nitrogen or molybdenum, according to the percentages already mentioned, p-type and/or n-type; including the use of a tantalum pentoxide matching layer of the active oxide semiconductor to the dielectric, see for instance, FIGS. 3 and 14 (4) and the encapsulating material, the magnesium fluoride, see FIG. 1, (9).

The present invention is related to the use of new semiconductors based on multi-component copper and nickel and gallium-tin-zinc-titanium-copper oxides alloy; which is designated as $OCu_xNi_y$ and GSZTCO; where their component the oxide elements have different compositions as, x which represents the copper molar content, y represents the nickel molar content, m represents the gallium molar contents, n represents the tin molar content, w represents the zinc molar content, z represents the titanium molar content, p the copper molar content and where the x:y or m:n:w:z:p compositions can be respectively of: 1:1, 1:2, 1:3, 3:1, 100:1 or 1:1:1:1:1, 1:10:10:10:10; 10:1:1:1:1; 1:1:1:5:10; 1:5:10:0,5:0,1; 5:5:10: 0,1:0,5; or other compositions where the minimum percentage of a component in the mixture is 0.005 and the maximum is 0.995, processed at temperatures below 100° C.; with or without the presence of UV light, see FIG. 8, (28), and that can be annealed after device manufacture.

The present invention is related to the use of multicomponent oxides designated by $OCu_xNi_y$ and GSZTCO, in different percentage compositions of their components translated by x:y and m:n:w:z:p; that may also contain another impurity to control the majority of the carrier types in the semiconductor, such as, zirconium or nitrogen in amounts that can go up to 0.20 of the molar composition and can even substitute one or two elements of the oxides composition of the present invention, and processed at room temperature or temperatures below 100° C.; using physics, physics-chemical or chemical deposition techniques, such as, thermal evaporation using multiple evaporation sources distributed along the opposite plain, to the one that is in the static form or in movement (roll on) substrate where the films will be deposited, function of the growth rate envisaged, see FIGS. 8 and 9, (24) and (29); the de or rf sputtering, assisted or not magnetron assisted with a gas injection performed close to the cathode region, see FIG. 10, (27) e (35); the ink-jet process where nanodrops of a chemical solution are atomized and heated, see FIGS. 11, (40) and (43); using a load lock system to introduce the substrates in the processing/deposition chamber with a reference base pressure as low as 1e Pa; and evaporating source to substrate distances which are the final dimensions of the substrate to be used, wherein all processes can be taken in a reactive or not reactive, that is, in an environment that contains or not contains an oxidant element like oxygen with partial pressures that vary between 10 Pa to $10^{-4}$ a or not oxidant, like Argon, Helium or Xenon, or reactive like hydrogen or fluor or nitrogen; in their single, basic or acid forms in proportions that may vary between $10^{-2}$ Pa to $10^{-5}$ Pa and growth rates that can vary between 0.1 nms$^{-1}$ to 10 nms$^{-1}$, by varying the applied current to the resistive element (thermal evaporation) or the applied power density between 0.01 Wcm$^{-2}$ to 20 Wcm$^{-2}$; (sputtering) with different target to substrate distances, where the deposition process can occur either using a target alloy or a ceramic target that contains all elements predefined or by co-evaporation or co-sputtering of alloys that contains all elements required for the final film composition. For instance, for substrates with 10 cm×10 cm dimensions, the source to substrate distance may vary between 2 to 30 cm, and can be as high as 150 cm, for substrates 1 m×1 m size.

The present invention is related to the use of multicomponent oxides alloys designated as $OCu_xNi_y$ and GSZTCO, in which their components have compositions of different proportions, translated by the proportion's compositions: x:y and m:n:w:z:p, that may also contain another impurity to control major carrier types using metallic composites of: Cu and Ni and of Ga, Sn, Zn, Ti and Cu, in a reactive atmosphere in the presence of UV light or ceramic materials containing the desired elements to reach the films composition wanted results, such as, $[Cu_aO, com\ 1{\leq}a{\leq}2]+[Ni_bO, with\ 1{\leq}b{\leq}3]$ or $[Ga_2O_3]_m+[SnO_{a(1-2)}]_n+[ZnO]_w+[TiO_{a(=1-2)}]+[Cu_aO, 1{\leq}a{\leq}2]$, plus the impurity previously established, in a reactive or not reactive atmosphere, as previously defined and in which the doping elements can be in the metallic solid form, such as, Zr or ceramic, for instance, ZrO or in the gas form, such as nitrogen.

The present invention is related to the use of multicomponent oxides designated as $OCu_xNi_y$ and GSZTCO, in which their constituents's proportions have different compositions, translated by the composition proportions x:y and m:n:w:z:p; manufactered in conditions already referred and the deposition conditions, namely the presence of reactive gases like oxygen or hydrogen, using partial pressures in a range of values already mentioned: allows to control the electrical and optical performances of materials manufactured, concerning free carriers (electrons or holes, respectively for n-type or p-type materials), electrical conductivity (from $10^{-14}$ Scm$^{-1}$ to $10^5$ S.cm$^{-1}$), carriers mobility, degree of films compactness (should be high), films' roughness (should be as flat as possible), the dielectric constant, the optical absorption and their reflectivity, for films with thicknesses in the range from 1 nm to 10000 nm, deposited in metallic, glassy, polymeric or cellulosic paper substrates, with an amorphous or crystalline structure, to be applied in electronics or optoelectronic devices as a passive electronic material, for instance, as an ohmic transparent or not transparent electrode contact or as a dielectric material with a high resistivity or to make blocking layers or matching layers in electronic and optoelectronic devices based, namely, in heterojunctions, that is, the junction of two materials with different electronic affinities.

Figure 5:
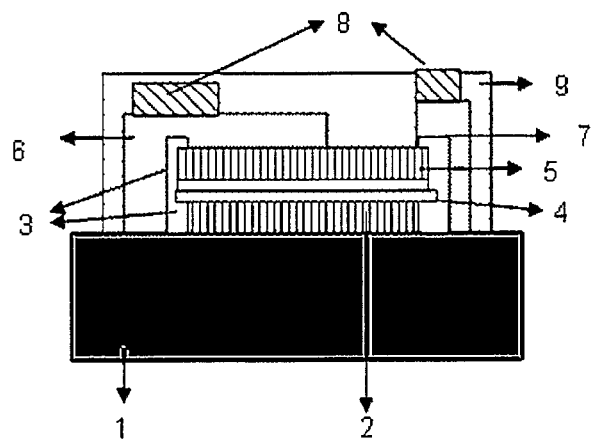
FIG. 5—Cross section view of a staggered asymmetric showing the TFT showing the channel, source, drain and dielectric regions, the matching layer from the dielectric to the oxide semiconductor used in the channel region, the metallic contacts, the encapsulating layer according to the comment numbers.
Figure 6:
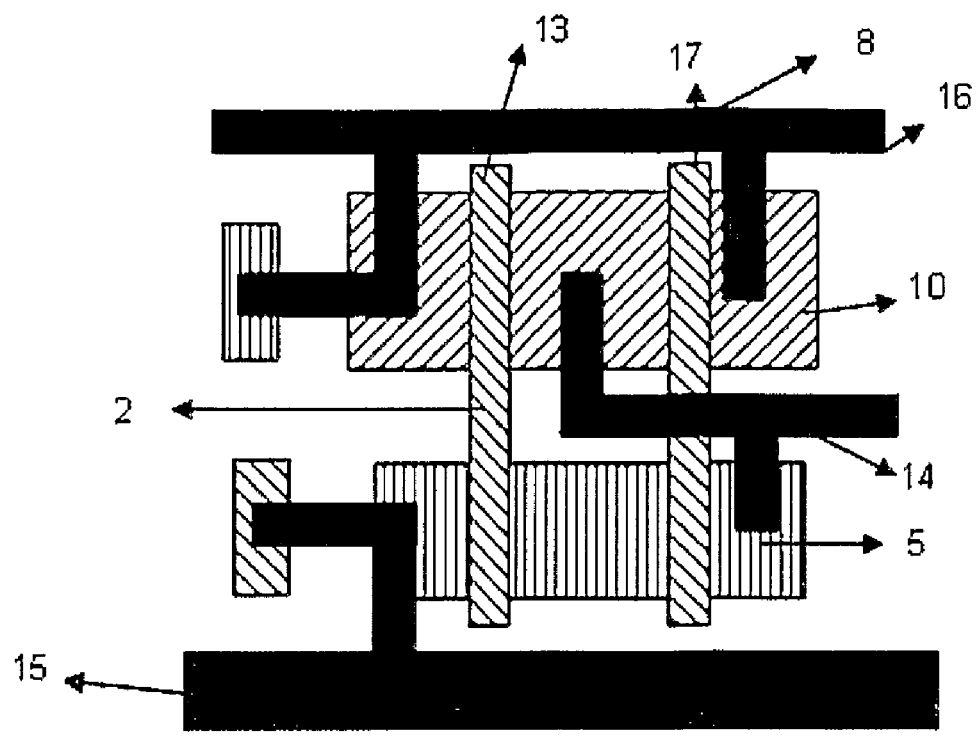
FIG. 6—Perspective view of a NAND logic gate based on CMOS structures as depicted in FIG. 1 according to the comment numbers: 17—Second voltage input of the logic gate.
Figure 7:
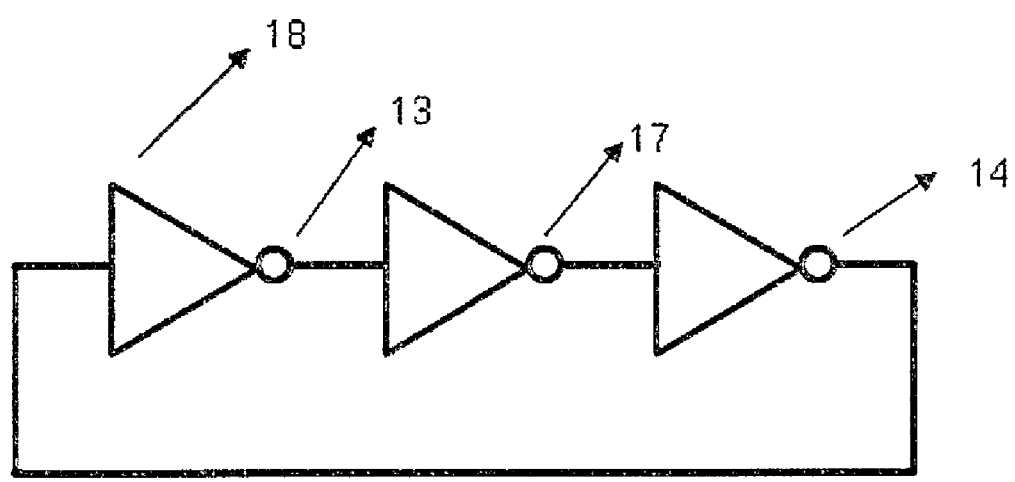
FIG. 7—Electronic circuit sketch of an o-Ring oscillator based in three CMOS inverter circuits as referred in FIG. 1, according to the comment numbers.

The present invention is related to the use of multicomponents oxides designated as $OCu_xNi_y$ and GSZTCO, in proportions of different compositions of their components translated as x:y and m:n:w:z:p ;that may also contain another impurity to control the majority of carrier types in the semiconductor, manufactured using the process conditions already described for electronic and optoelectronic applications; as a passive or active electronic material, as it is the case, when manufacturing heterojunctions, see FIGS. 14, (4) and (10) and the transistor devices, namely the CMOS (see FIG. 1), the TFT, see FIG. 3, (5), logic gates, see FIG. 6 (5), (10); with thicknesses 5 nm or as thick as 1000 nm, deposited in any type of substrate, namely glassy, metallic, polymeric or cellulosic paper, at temperatures below 100° C., that can be encapsulating by using stable composites or alloys, such as, magnesium fluoride, see FIGS. 1, 3, 4 and 5, (9) wherein the drain and source regions can be based on metallic like contacts, such as, titanium, chromium or gold, see FIGS. 1, 3,4, 5, 6 and 14, (6), (7), or highly conductive oxides, namely, doped GSZTCO or another one oxide semiconductor such as the indium oxide zinc doped or the zinc oxide gallium doped.

The present invention is related to the use of multicomponent oxides designated as $OCu_xNi_y$ and GSZTCO, in which their constituents have have proportions of different compositions translated as x:y and m:n:w:z:p; and that may also contain another impurity to control the major carrier types in the semiconductor manufactured and used in the conditions already mentioned; whereupon the dielectric material to be used in the conception of devices can be an organic material, for instance in TFT can be an inorganic material, like silicon dioxide or a high dielectric material, such as tantalum oxide or hafnia, zirconia, yttrium oxide, alumina or composites like hafnia/ tantalum oxide, alumina/tantalum oxide, zirconia/ tantalum oxide, alumina/tantalum oxide, zirconia/ tantalum oxide, tantalum pentoxide/silicon dioxide, Alumina/titania, or an organic material such as polymers of low molecular weight with electrical above $10^{15}$ $\Omega \cdot cm$; such as PMMA, POMA or Mylar, but where the matching between the dielectric and the active semiconductor is made by a tantalum pentoxide film with thicknesses between 1 nm to 1000 nm, see FIGS. 1, 3, 4, 5 and 6, (4).

The present invention is related to the use of multicomponent oxide alloys designated as $OCu_xNi_y$ and GSZTCO, constituents have proportions of different compositions translated by x:y and m:n:w:z:p, and that may also contain another impurity to control the major carrier types in the semiconductor manufactured and applied in the conditions already described; wherein, after the device manufacture or between manufacture device steps, namely, the channel region and the drain and source regions the device structure as it is, can be or not annealed in a controlled atmosphere (containing a gas like a mixture of 95% nitrogen and 5% hydrogen, or using an argon atmosphere), at temperatures as high as 250° C., during times that can vary between 50 minutes and 6 hours, function of the type of substrate used.

1. Preparation of $OCu_xNi_y$

In order to process the $OCu_xNi_y$ films we must, firstly select the desired y:x composition, as already referred, in order to obtain a p-type material, wherein the minimum percentage of each element in the mixture is 0.005 and the highest one is 0,995, processed at temperatures below 100° C., with or without heat treatment performed after the manufacture process of the material, in a controlled or not controlled atmosphere.

Once selected the $OCu_xNi_y$, composition the next step is to know if one wants to introduce impurities to control the major carrier types in the semiconductor, such as, zirconium or nitrogen, where the maximum proportion of one of them or both impurities is 0.20 of the $OCu_xNi_y$ molar composition and can even replace one of the elements of the initial composition.

After selecting the required composition and the impurities to be added, it is selected the way how the materials will be deposited: as a composite or set of metallic or ceramic composites or a chemical solution or solutions; depending on the deposition technique to be selected and if we want to grow films using only one evaporation/target source or several, using vacuum systems and an inert or reactive atmosphere, ionize or not, to transfer the decomposed species towards the substrate, such as, argon and/or oxygen or another gas or if we use an aqueous basic, neutral or acid solution but, whatever the technique selected, with or without the presence of UV light to assist the growing process on the selected substrate for that matter.

Concerning the deposition process, containing or not impurities, we can select a physical, chemical-physical or chemical technique, using a load lock chamber to introduce the substrates in the deposition chamber with a reference pressure as low as $10^{-7}$ Pa and substrate to evaporation source distance function of the substrate size. For instance, for substrates with sizes 10 cm×10 cm, the distances may vary between 2 cm-30 cm and, can be as high as 150 cm, for 1 m×1 m substrates size.

For instance, if the selected deposition technique is the resistive or electron gun thermal evaporation, (see FIGS. 8 and 9) with a reference base pressure as low as $10^{-7}$ Pa, we can use multiple evaporation sources distributed along the opposite plan to that that contains the substrate face wherein the deposition will take place, under a static way, FIGS. 8 and 9, (23) or a roll to roll way, function of the growth rate desired. If the deposition sources are metallic, as already referred, the elements can be in one or more alloys' composition, for instance, Cu—Ni one evaporation source and distributed alternately with another containing the desired impurities and whereupon the process atmosphere should be oxidant, that is, we must introduce oxygen to the process chamber, see FIG. 8, (25), in order to have an oxygen partial pressure between $10^{-2}$ Pa and $10^{-5}$ Pa, see FIG. 8, (22): in which the control of the deposition pressure is performed by controlling the filament current used, see FIGS. 8 and 9, (27) wherein the case of resistive thermal evaporation a low power voltage (below 50 V) and high current (up to 500 A) source is used, for a given growth rate (from 0.01 $nms^{-1}$ to 20 $nms^{-1}$), function of the substrate size used and, of the substrate evaporation source distance and of the number of evaporation sources used.

In case the starting materials used in the evaporation are in the ceramic form, that is, in the oxide form, the based constituted elements can be in the form of one or more ceramic compounds, containing the desired Cu—Ni composition, working as an evaporating source that will be distributed alternately with another ceramic composite source containing the desired impurities to be used in the film/final layers, using or not an oxidant atmosphere by having an partial oxygen pressure that varies between $10^{-2}$ Pa and $10^{-7}$ Pa, in which the control of the deposition pressure is performed by controlling the filament currently used, wherein the case of resistive thermal evaporation a low power voltage (below 50 V) and high current (up to 500 A) and, in the case of an electrode canon (see FIG. 9), the filament current can be as high as 7A; function of the substrate size used and, of the substrate evaporation source distance and of the number of evaporation sources used as well as the expected growth that can be as low as 0.01 $nms^{-1}$ to 20 $nms^{-1}$.

In case that the starting materials used for the evaporation are in the ceramic form, that is, in the oxide form, the based constituted elements can be in the form of one or more ceramic compounds, containing the desired Cu—Ni composition, working as the evaporation source that will be distributed alternately with another ceramic composite source containing the desired impurities to be used, using or not an oxidant atmosphere by having an partial oxygen pressure that varies between $10^{-2}$ Pa and $10^{-7}$ Pa, for deposition pressures that may vary between $10^{-1}$ Pa and $10^{-4}$ Pa.

Whatever the manufacture condition selected to manufacture $Cu_xNi_y$ by thermal evaporation from the ones above described, we can use zirconium impurities in the metallic or ceramic form, included or not in the alloys compositions that contain the main Cu—Ni composition to be deposited directly or by co-deposition, that is, using more than one evaporation sources containing $OCu_xNi_y$ wherein the percentage of the impurity to be incorporated in the thin films to be manufactured (between 0.005 and 0.20), is made through the energy used (electrical current); that also controls the growth rate and the final state of the films' at deposition temperatures that may vary between room temperature (20° C.) and 100° C., function of the type of substrate used (glass, polymer, metal or cellulosic paper).

In addition to the thermal evaporation, we may use the dc or rf sputtering deposition technique, with or without the presence of a magnetron to confine the deposition process, whereupon the targets to be used can be metallic containing the required Cu—Ni composition, see FIGS. 10, (34), (35), (37) and (38), under an oxidant atmosphere or the annealing process takes place under an oxidant atmosphere or by using ceramic evaporation sources with the initial selected $OCu_x$-$Ni_y$ composition, $[Cu_aO,$ with $1 £ a £ 2]+[Ni_bO,$ com $1 £ b £ 3]$ that can contain one or more metallic or ceramic or gas impurities, such as, Zr, $ZrO_x$, or $N_2$, wherein the final film composition depends on the energy used in each target (evaporation source now) or by simultaneous co-sputtering of targets containing the required components to be incorporated in the final thin film, by proper control of the energy and sputtering times of each one.

In the case where the deposition processes, it is performed by sputtering the inlet gas can be common or different for the set of gases used whereupon, the reactive gases (oxygen and/or hydrogen, and/or fluor) are introduced as close as possible of the surface region that contains the substrate; in which, the film will be deposited and where the inert gas (argon, helium or xenon) is introduced close to a cavity containing the targets ('hollow cathode'), and where the partial pressures may vary between $5 \times 10^{-2}$ Pa to $10^{-5}$ Pa, for a total deposition pressure that may vary between $5 \times 10$ Pa to $10^{-4}$ Pa, using growth that can vary between 0.01 $nms^{-1}$ to 20 $nms^{-1}$, function of the power density used that can vary between 0.01 $Wcm^{-2}$ to 20 $Wcm^{-2}$ depending on the substrate size, number of targets, substrate target distance and if the structure of the film manufactured is amorphous or crystalline, using process temperatures below 100° C., see FIGS. 10 (25 and 35), (27), (37 and 38), (33 and 36), and where the percentage of impurities incorporated in the film is made by controlling the power density (between 0.01 $Wcm^{-2}$ to 1 $Wcm^{-2}$), applied to the target that contains the impurities (co-sputtering), that is, the growth rate of the impurities, when compared to that of the main target, can vary to match the required result, thin film composition, concerning impurities introduced, between 0.005 to 0.20 and using temperatures that may vary between room temperature (20° C.) and 100° C., function of the type of substrate used (glass, polymer, metal or cellulosic paper), see FIG. 10, (20).

In addition to the two techniques described above, the $OCu_xNi_y$ thin films can be grown by other physics, physical-chemical or chemical methods such as thermal evaporation by pulsed laser, atomic layer epitaxial, or molecular epitaxial or sol-gel or electrodeposition or spray atomized pyrolysis, or by ink-jet, see FIG. 11, or spin coating, all those techniques should be used with or without the presence of UV light and an oxidant atmosphere like oxygen or a non reactive atmosphere like argon, helium or xenon or a reactive atmosphere like, hydrogen or fluor or nitrogen, in their gas, acid or basic forms.

If the deposition method selected is the ink-jet, the elements to be deposited are in the form of a basic, neutral or acid chemical compound that is diluted in an aqueous solution containing an alcohol (ethyl, methyl or propanol); another stabilizing element of the solution, being the deposition performed by spraying the heated or not heated atomized solution over the substrate that can be heated to temperatures up to 400° C. (function of the solvent and substrate selected), see FIGS. 11, (19), (20), (40), (41) and (43).

Whatever the chemical deposition method selected, the films to be deposited are based in unique solutions containing the elements to be deposited; including the impurities at growth rates that can vary between 0.01 $nms^{-1}$ and 10 $nms^{-1}$, for instance, it is a dissociation rate function of the species, dimensions of the nano-drops, of the injector, or of the atomizer used.

Whatever the chemical deposition method selected, the films have thicknesses between 1 nm and 1000 nm, function of the application envisaged, as semiconductor in nanoelectronics, microelectronics, using insulating substrates, such as, glass or polymer or cellulosic paper or conductive substrates like, metal stainless steel or molybdenum or semiconductor substrates like crystalline or polycrystalline silicon or using other oxides as substrates, p-or n-type, function of the envisaged application.

Whatever the deposition method selected the films can be processed under a static (substrate stopped during the deposition process) or dynamic (the substrate is moving during the deposition process), in order to allow a homogeneous and uniform film deposition over the entire substrate area, either the films have an amorphous or crystalline structure.

Once the films with the desired thickness are processed on the substrates previously selected, as single layer or as layers of a desired device, they are annealed at temperatures ranging from 60° c to 300° C., using times that can vary between 50 minutes to 6 hours, using a controlled atmosphere that may contain oxygen, or nitrogen or a mixture of hydrogen and nitrogen, or nitrogen and fluor or nitrogen and oxygen, in proportions that can vary between 0.1:99.9 to 0.1:0.1:9.8 of the gas composition previously mentioned and performed at atmospheric pressure or under vacuum ($10^{-2}$ Pa to 1000 Pa).

Depending on the composition and deposition conditions selected, including the annealing process, there will be the electrical, electronic and optical properties of the films manufactured, concerning the nature of free transport carriers (electrons or holes, that is the material is n-type or p-type), electrical conductivity, mobility carriers, degree of films compactness, dielectric constant, optical absorption, materials reflectivity. Theses properties can be varied by changing the films composition or the oxygen containing, that is to say, the conductivity can be by this varied between $10^{-14}$ $S.cm^{-1}$ to $10^5$ $S.cm^{-1}$; for films with the thicknesses that can vary between 1 nm to 10000 nm, presenting an amorphous or crystalline structure, highly compact and low surface roughness, to be applied in electronic and optoelectronic applications as a passive material, like, for highly conductive ohmic contacts, with or without transparency associated, or as a dielectric material with high electrical resistivity, or to make blocking layers or matching layers in electronic and optoelectronic devices, namely, in heterojunctions, that is, the union of two materials with different electronic affinities and that need an extra thin layer to make the match between them or as an active electronic material, to be used to manufacture p-n heterojunctions, unipolar transistors like, TFT or C-MOS and other devices, using any type of substrate, such as, glass, polymer, metal or cellulosic paper.

2. GSZTCO Preparation

In order to manufacture GSZTCO films, the m:n:w:z:p film compositions must be first selected, as already referred, to obtain a n-type material, wherein the minimum percentage of each element in the mixture is of 0.005 and the highest one 0.995, processed at temperatures below 100° C., with or without heat treatment after the fabrication process of the material, in a controlled or not controlled atmosphere.

Once the GSZTCO composition is selected, the next step is to know if one wants to introduce impurities to control the type of majority carriers in the semiconductor, such as zirconium or nitrogen, wherein the maximum proportion of impurities is up to 0.20 of the GSZTCO molar composition being the substitution of one or two elements of the initial composition possible.

After selecting the required composition and the impurities to be added, one must select the way in which the materials will be deposited: either by means of a composite, set of metallic or ceramic composites, or a chemical solution or solutions, deposition technique to be selected and, if we want to grow films from a single or several evaporation/target source(s), using vacuum systems and an inert or reactive atmosphere, be it ionized or not, to transfer the decomposed species towards the substrate, such as argon, oxygen or another gas or if we use an aqueous basic, neutral or acid solution but, whatever the technique selected, with or without the presence of UV light to assist the growing process on the selected substrate.

As far as the deposition process is concerned, either containing impurities or not, we can select a physical, chemical or chemical-physical technique, using a load lock chamber to introduce the substrates in the deposition chamber with a reference pressure, that can be as low as $10^{-7}$ Pa, and substrate to evaporate the source distance function of the substrate size. For instance, for substrates measuring 10 cm×10 cm, the distances may vary between 2 cm-30 cm and they can be as high as 150 cm, for substrates measuring 1 m×1 m.

For instance, if the deposition technique is the resistive or electron gun thermal evaporation, (see FIGS. 8 and 9) with a reference base pressure down to $10^{-7}$ Pa, one can use one or multiple evaporation sources multi-distributed along the opposite plan to the substrate face where the deposition will takes place, under a static way, FIGS. 8 and 9, reference (23) or a roll to roll way, function of the growth rate desired. As previously referred, if the deposition sources are metallic, the elements can already be in one or more alloys' composition, such as one evaporation source containing Ga—Sn—Zn—Ti—Cu, operating as an evaporation source which will be alternately distributed with a source containing the impurities to be introduced in the final film, wherein the process atmosphere should be oxidant, that is, oxygen must be introduced into the process chamber, see FIG. 8, (25), in order to obtain an oxygen partial pressure rating between $10^{-2}$ Pa and $10^{-5}$ Pa, see FIG. 8, (22), where the deposition pressure is performed by controlling the filament current used, see FIGS. 8 and 9, (27) which—in a case of resistive thermal evaporation—includes a low power voltage (up to 50 V) and high current (up to 500 A) source, for a given growth rate (from 0.01 nms$^{-1}$ up to 20 nms$^{-1}$), function of the substrate size used and so, of the substrate evaporation source distance and of the number of evaporation sources used.

When the starting materials used for the evaporation are in the ceramic form, that is, in the oxide form, the based constituted elements can be can be in the form of one or more ceramic containing the desired Ga—Sn—Zn—Ti—Cu composition, working as the evaporation source that will be distributed alternately with another ceramic composite source containing the desired impurities to be used, using or not an oxidant atmosphere by having an partial oxygen pressure that varies between $10^{-2}$ Pa and $10^{-7}$ Pa, for deposition pressures that may vary between $10^{-1}$ Pa and $10^{-4}$ Pa and where the control of the deposition pressure is performed by controlling the filament current used, see FIGS. 8 and 9, (27) where for the case of resistive thermal evaporation a low power voltage (below 50V) and high current (up to 500 A) source is used, for a given growth rate (from 0.01 nms$^{-1}$ to 20 nms$^{-1}$), function of the substrate size used and so, of the substrate evaporation source distance and of the number of evaporation sources used.

Should the ceramic materials be selected for thermal evaporation, meaning that they are already in oxide form, the elements the based constituted elements can already be in the one or more ceramic forms, containing for example the desired Ga—Sn—Zn—Ti—Cu composition, working as an evaporation source that will be alternately distributed with a source containing the impurity(ies) to be introduced in the film, in another ceramic composition, in an oxidant or non-oxidant atmosphere, meaning by introducing oxygen into the chamber, in order to obtain a partial oxygen pressure, besides inert gas, such as argon, which might vary between $10^{-2}$ Pa and $10^{-7}$ Pa, for a total deposition pressure that might vary between $10^{-1}$ Pa and $10^{-4}$ Pa.

Whatever the production condition selected to manufacture GSZTCO by thermal evaporation, we can use zirconium impurities in the metallic or ceramic form, whether or not included in the alloy compositions that contain the main Ga—Sn—Zn—Ti—Cu composition to be deposited by co-deposition, that is using more than one evaporation sources containing Ga—Sn—Zn—Ti—Cu elements and where the percentage of the impurity to be incorporated in the thin films to be produce (between 0.005 and 0.20) is made through the energy used (electrical current), that also controls the growth rate and the final state of the films at deposition temperatures that can vary between room temperature (20° C.) and 100° C., function of the type of substrate used (glass, polymer, metal or cellulosic paper).

Besides the thermal evaporation we may use the dc or rf sputtering deposition technique, with or without the presence of a magnetron to confine the deposition process and where the targets to be used can be metallic containing the required Ga—Sn—Zn—Ti—Cu composition, see FIGS. 10, (34), (35), (37) and (38), under an oxidant atmosphere or the annealing process takes place under an oxidant atmosphere or by using ceramic evaporation sources with the initial selected GSZTCO composition, $[Ga_2O_3]_m+[SnO_{a(1-2)}]_n+[XnO]_w+[TiO_{a(=1-2)}]+[Cu_aO, 1 \leq a \leq 2]$ that can contain one or more metallic or ceramic or gas impurities such as Zr, $ZrO_x$, or $N_2$ and where the final film composition depends on the energy used in each target (evaporation source now) or by simultaneous co-sputtering of targets containing the required components to be incorporated in the final thin film, by proper control of the energy and sputtering times of each one.

In the case where the deposition process is performed by sputtering the inlet gas through a common or different way-in, in which the reactive gases (oxygen and/or hydrogen, and/or fluor) are introduced as close as possible of the surface region that contains the substrate upon which the film will be deposited, and in which the inert gas (argon, helium or xenon) is introduced close to a cavity containing the targets (hollow cathode'), and in which the partial pressures may vary between $5 \times 10^{-2}$ Pa to $10^{-5}$ Pa, for a total deposition pressure that may vary between $5 \times 10$ Pa to $10^{4}$ $^-$Pa, using growth that can vary between 0.01 nms$^{-1}$ to 20 nms$^{-1}$, function of the power density used that can vary between 0.01 Wcm$^{-2}$ to 20 Wcm$^2$ depending on the substrate size, number of targets, substrate target distance and if the structure of the film produced is amorphous or crystalline, using process temperatures below 100° C., see FIGS. 10 (25 and 35), (27), (37 and 38), (33 and 36), and where the percentage of impurities incorporated in the film is made by controlling the power density (between 0.01 Wcm$^{-2}$ to 1 Wcm$^{-2}$), applied to the target that contains the impurities (co-sputtering) that is, the growth rate of the impurities, when compared to that of the main target, can vary to match the required final thin film composition concerning impurities introduced, between 0.005 to 0.20 and using temperatures that may vary between room temperature (20° C.) and 100° C., function of the type of substrate used (glass, polymer, metal or cellulosic paper), see FIG. 10, (20).

Besides the two techniques described above, the GSZTCO thin films can be grown by other physics, physical-chemical or chemical methods such as thermal evaporation by pulsed laser; atomic layer epitaxial, or molecular epitaxial; sol-gel or electrodeposition or spray atomized pyrolysis, or by ink-jet (see FIG. 11), spin coating, being all these techniques possible to be used with or without the presence of UV light and an oxidant atmosphere such as oxygen, or a non reactive atmosphere such as argon, helium or xenon, or a reactive atmosphere such as hydrogen or fluor or nitrogen, in gas, acid or basic forms.

If the ink-jet is selected for deposition method, the elements to be deposited are in the form of a basic, neutral or acid chemical compound that is diluted in an aqueous solution containing an alcohol (ethyl, methyl or propanol), and a stabilizer of the solution, being the deposition performed by spraying the heated or non-heated atomized solution over the substrate that can be heated to temperatures up to 400° C. (function of the solvent and substrate selected), see FIGS. 11, (19), (20), (40), (41) and (43).

Whatever the chemical deposition method selected, the films to be deposited are based in unique solutions containing the elements to be deposited, including the impurities at growth rates that can vary between 0.01 $nms^{-1}$ and 10 $nms^{-1}$, function for instance of the dissociation rate of the species, dimensions of the nano-drops, of the injector, or of the atomizer used.

Whatever the deposition method selected, the films comprise thicknesses between 1 nm and 1000 nm, function of the application envisaged, as semiconductor in nano-electronics, microelectronics, using insulating substrates such as glass or polymer or cellulosic paper or conductive substrates such as metal stainless steel or molybdenum or semiconductor substrates such as crystalline or polycrystalline silicon or using other oxides as substrates, p-or n-type, function of the envisaged application.

Whatever the deposition method selected the films can be processed under a static (substrate stopped during the deposition process) or dynamic (the substrate is moving during the deposition process) procedure, in order to allow a homogeneous and uniform coating over the entire substrate area, either the films being amorphous or crystalline.

Once the films are processed with the the desired thickness, over the equality substrates previously selected, the films, as single layer or as layers of a desired device, are annealed at temperatures in from 60° c to 300° C., using times that can vary between 50 minutes to six hours, under a controlled atmosphere that may contain oxygen, nitrogen or a mixture of hydrogen and nitrogen, or nitrogen and fluor or nitrogen and oxygen in proportions that can vary between 0.1:99.9 to 0.1: 0.1:9.8 of the gas composition mentioned above and performed at atmospheric pressure or under vacuum ($10^{-2}$ Pa to 1000 Pa).

Depending on the composition and deposition conditions selected, including the annealing process, there will be the electrical, electronic and optical properties of the films produced, concerning the nature of free transport carriers (electrons or holes, that is the material is n-type or p-type), electrical conductivity, carriers mobility, degree of films compactness, dielectric constant, optical absorption, materials reflectivity. These properties can be altered by changing the film compositions or the oxygen content between $10^{-14}$ $S.cm^{-1}$ up to $10^5$ $S.cm^{-1}$, for films including a thicknesses between 1 nm to 10000 nm, presenting an amorphous or crystalline structure, highly compact and low surface roughness, to be applied in electronic and optoelectronic applications as a passive material, such as the highly conductive ohmic contacts, with or without transparency associated, or as a dielectric material with high electrical resistivity, or to obtain blocking layers or matching layers in electronic and optoelectronic devices, namely in heterojunctions, that is, the union of two materials with different electronic affinities which require an extra thin layer to adapt to each other or as an active electronic material, to be used to manufacture p-n heterojunctions, unipolar transistors such as TFT or C-MOS and other devices, using any type of substrate, namely glass, polymer, metal or cellulosic paper.

3. Preparation of Magnesium Fluoride (Encapsulating Layer)

To process the magnesium fluoride required as encapsulating layer in devices, see FIGS. 1, 3, 4, 5 e 6, (9), namely the one in contact with the environment of the device in which it will be applied, can be stoichiometric or non stoichiometric used and it is processed at temperatures under 100° C., with or without heat treatment in a controlled or non-controlled atmosphere.

To process the stoichiometric or non-stoichiometric magnesium fluoride, hereafter designated as $MgF_x$ on a surface of any active electronic device, as encapsulating layer of electronic or optoelectronic devices, in order to avoid the device degradation when exposed to the environment, which induces surface and shallow defect states, allows the in-diffusion of gas species such as oxygen, through structural defects or interstices of the amorphous or crystalline film, such as GSZ-TCO, that will lead to deep changes on the physical properties of the materials that constitute the device, namely the electrical and electronic properties, this material can be processed using any physical, physical-chemical or chemical technique, (see FIGS. 8, 9, 10 e 11), whether or not using a load lock chamber to introduce the substrates in the process chamber with a reference base pressure of that can decrease down to $10^{-7}$ Pa and distances between the evaporation source and the substrate which are function of the substrate size to be used, which are between 2 cm-30 cm for substrates 10 cm×10 cm in size, or above 150 cm for substrates 1 m×1 m in size and, can be deposited in the static or dynamic mode (rotation or roll to roll) ,followed by heating treatment in a controlled or not controlled atmosphere at temperatures under 350° C., function of the application and substrate selected.

Once selected the $MgF_x$ composition, the next step will comprise knowing the deposition technique to be used, whether the materials to be used are in the form of an alloy to be evaporated from a boat source, or in the form of a sintered target with the required proportions, followed by the temperature selection for the heating treatment and related annealing environment/atmosphere, when required.

For instance, if the selected deposition technique is the resistive or electron gun thermal evaporation, (see FIGS. 8 and 9) with a reference base pressure as low as $10^{-7}$ Pa, we can use one or multiple evaporation sources distributed along the opposite plan to the substrate face where the deposition will take place, under a static way, FIGS. 8 and 9, (23) or a roll to roll method, function of the growth rate desired. If the deposition sources are in the single or sintered powder form or in the form of pellets or foils, where besides that the process atmosphere must be hydrogenated and/or fluorinated, that is, hydrogen and/or fluor must be introduced to the process chamber, where the gas' partial pressure of these reactive gases should be between $10^{-2}$ Pa to $10^{-5}$ Pa controlling the filament current used, whereas for the case of resistive thermal evaporation a low power voltage (below 50 V) and high current (up to 500 A) source is used, while for the electron gun case the current in the gun filament can be as high as 7A, depending on the substrate size used and so, from the source to substrate distance and the number of evaporation sources to be used, using growth rates that can vary between 0.01 nms$^{-1}$ to 20 nms$^{-1}$.

Besides the thermal evaporation we may use the dc or RF sputtering deposition technique, with or without the presence of a magnetron to confine the deposition process (see FIG. 10) and where the targets to be used contain the selected MgF$_x$ and where the deposition process takes place under the possible presence of a reactive gas such as hydrogen and/or fluor and/or nitrogen and or oxygen, besides the inert carrier gas such as argon using partial gas pressures that vary $5 \times 10^{-2}$ Pa to $10^{-5}$ Pa, for a total deposition pressure between $5 \times 10$ Pa to $10^{-4}$ Pa, using growth rates in the range of 0.01 nms$^{-1}$ to 20 nms$^{-1}$, function of the power density used that vary between 0.01 Wcm$^2$ to 20 Wcm$^{-2}$, depending on the substrate or devices sizes to be coated, the number of targets used and the nature of the structure of the film grown (amorphous or crystalline) at process temperatures that may vary between 20° C. to 350° C.

Besides the two techniques above described, the MgF$_x$ thin films can be grown by other physics, physical-chemical or chemical methods such as thermal evaporation by pulsed laser; atomic layer epitaxial or molecular epitaxial; sol-gel or electrodeposition; sprayed atomized pyrolysis, ink-jet, (see FIG. 11), or spin coating, taken that all these techniques should be used with or without the presence of UV light and under an oxidant atmosphere such as oxygen or a non-reactive atmosphere such as argon, helium or xenon or a reactive atmosphere such as hydrogen, fluor or nitrogen, in their gas, acid or basic forms.

If the deposition method selected is chemical, the elements to be deposited are in the form of a basic, neutral or acid chemical solution that is placed in an aqueous solution containing an alcohol (ethyl, methyl or propanol), and a stabilizer of the solution, being the deposition performed by spraying the heated or non-heated solution, whether by electrolysis or not, over the substrate that can be heated to temperatures up to 400° C. (function of the solvent selected), or by atomization of the solution over the heated substrate or via heated atmosphere or ink jet, containing the solution, by local heating of the substrate or environment through which the substrate has to go through.

Whatever the chemical deposition method selected, the films to be deposited are based in unique solutions containing the elements/compositions to be deposited, the growth rates can vary between 0.01 nms$^{-1}$ to 10 nms$^{-1}$, function of an electrical current which goes through the solution (electrolysis)or the dissociation rate of the species and its deposition without any sort of passage through the current or the way in which the atomization occurs, (for dimensions of the nanodrops, of the injector, the atomizer, or other information, see FIG. 11 (40)).

Whatever the chemical deposition method selected, the films may be between 0.5 nm and 1000 nm thick, function of the application envisaged and surface conditions where the film will be deposited to perform the encapsulation.

Whatever the deposition method selected the films can be processed under a static (substrate stopped during the deposition process) or dynamic procedure (the substrate is moving during the deposition process), in order to allow a homogeneous and uniform deposition of the films over the entire substrate area, be it either of amorphous or crystalline structure.

Once the films are processed with the desired thickness(es) on the substrates previously selected, the films, either in a singular way or according to the structure of the desired device, are annealed at temperatures in the range from 60° c to 300° C., using times that can vary between 50 minutes to six hours, function of the substrate and desired application, an atmosphere that may contain oxygen, nitrogen or a mixture of hydrogen and nitrogen, or oxygen and nitrogen, or nitrogen and fluor or a mixture of oxygen, hydrogen and nitrogen in proportions that can vary between 0.1:99.9 and 0.1:0.1:9.8 of the gas composition previously mentioned and performed at atmospheric pressure or under vacuum ($10^{-2}$ Pa to 1000 Pa).

4. Tantalum Pentoxide Preparation (Matching Layer)

To process the stoichiometric or non-stoichiometric tantalum pentoxide, hereafter designated by Ta$_x$O$_y$, as matching layer of an oxide semiconductor to another oxide or dielectric such as silicon dioxide or silicon nitride or other, see FIGS. 1, 3, 4 e 5, (4) and (3), in order to guarantee the electronic stability of the interface, thus avoiding the instabilities promoted by sorption or diffusion of impurity contaminates in the gaseous or not gaseous form, processed at temperatures below 100° C., using a physical, physical-chemical, or chemical deposition technique, with or without a load locking system to introduce the substrates in the deposition chamber, at a reference pressure as low as $10^{-7}$ Pa and the distance substrate source, which the ultimate function of the substrate size, to vary between 1 cm-30 cm , for substrates 10 cm×10 cm in size, or up to 150 cm , for substrates 1 m×1 m in size, which can be deposited in the static or dynamic mode (rotation or roll to roll) ,followed by a heat treatment in a controlled atmosphere up to 350° C., function of the application and nature of selected substrate.

In order to manufacture Ta$_x$O$_y$ as a matching layer between two other semi-conductors or between a semiconductor and a dielectric, or a semiconductor and an encapsulating layer, the material to be deposited must be selected, such as the metal Ta, deposited in an oxidant atmosphere or from a ceramic target containing the desired Ta$_x$O$_y$ composition, followed by the selection of the adequate process and annealing temperatures and related environment/atmosphere, when required.

For instance, if the selected deposition technique is the resistive or electron gun thermal evaporation, with a reference base pressure as low as $10^{-7}$ Pa(see FIGS. 8 and 9), one might use one or multiple evaporation sources distributed along the opposite plan of the substrate face, where the deposition will take place, under a static way, FIGS. 8 and 9, (23) or a roll to roll method, function of the growth rate desired. In such cases where the evaporation sources are in the single or sintered powder form, or aggregated, or in the form of pellets or foils, where the process atmosphere must nonetheless be hydrogenating, containing or not other gas elements such as hydrogen, fluorine or nitrogene, thus obtaining a partial pressure of these reactive gases between $10^{-2}$ Pa to $10^{-5}$ Pa controlling the filament current used, where for the case of resistive thermal evaporation a low power voltage (below 50 V) and high current (up to 500 A) source is used, while for the electron gun case the current in the gun filament can be up to 7A, besides using an accelerating voltage usually superior to 1500-2000 V, (see FIGS. 9, (27), (28), (29), (30) and (31)), function of substrate dimension and therefore source to substrate distance and the number of evaporation sources to be used, comprising growth rates that can vary from 0.01 nms$^{-1}$ to 20 nms$^{-1}$.

Besides the thermal evaporation the dc or RF sputtering deposition technique may be used(see FIG. 10), with or without the presence of a magnetron to confine the deposition process and where the targets to be used contain the selected $Ta_xO_y$ composition, in the metallic (Ta) or ceramic ($Ta_xO_y$) form and where the deposition process takes place under the presence or absence of a reactive gas such as hydrogen and/or fluoride and/or nitrogen and or oxygen, besides the inert carrier gas such as argon using partial gas pressures that vary $5 \times 10^{-2}$ Pa to $10^{-5}$ Pa, for a total deposition pressure between $5 \times 10$ Pa to $10^{-4}$ Pa, using growth rates in the range of 0.01 $nms^{-1}$ to 20 $nms^{-1}$, function of the power density used that varies between 0.01 $Wcm^{-2}$ to 20 $Wcm^{-2}$, depending on the substrate or devices sizes to be coated, the number of targets used and the nature of the structure of the film grown (amorphous or crystalline) at process temperatures that may vary between 20° C. to 350° C.

Besides the above-described techniques, the $Ta_xO_y$ thin films can be grown by other physics, physical-chemical or chemical methods such as thermal evaporation by pulsed laser; atomic layer epitaxial or molecular epitaxial; sol-gel or electrodeposition, spray atomized pyrolysis, by ink-jet, spin coating, taken that all these techniques can be used with or without the presence of UV light and an oxidant atmosphere such as oxygen or a non-reactive atmosphere such as argon, helium or xenon or a reactive atmosphere such as hydrogen or fluor or nitrogen, in their gas, acid or basic forms.

If the deposition method selected is chemical, such as the ink-jet method, the elements to be deposited are in the form of a basic, neutral or acid chemical solution that is diluted in an aqueous solution containing an alcohol (ethyl, methyl or propanol), and a stabilizer of the solution, being the deposition performed by dipping or spraying the heated or non-heated atomized solution over the substrate, be it electrolysis or not, at temperatures that can rise up to 400° C. (function of the solvent and selected), or by atomization of the solution over the heated substrate or via heated atmosphere or ink jet, containing the solution, by local heating of the substrate or environment through which the substrate has to go through (see FIG. 11).

Whatever the chemical deposition method selected, the films to be deposited are based in unique solutions containing the elements/compositions to be deposited, the growth rates can vary between 0.01 $nms^{-1}$ to 10 $nms^{-1}$, function of an electrical current which goes through the solution (electrolysis)or the dissociation rate of species and its deposition without any sort of passage through the current or the way in which the atomization is occurs, (for dimensions of the nano-drops, of the injector, the atomizer, or other information, see FIG. 11 (40)).

Whatever the deposition method selected the films may be between 0.5 nm and 1000 nm thick, function of the application and material where the film will be deposited to perform the matching of the layers and the stabilization of the corresponding interface.

Whatever the deposition method selected the films can be processed under a static (substrate stopped during the deposition process) or dynamic procedure(the substrate is moving during the deposition process), in order to allow a homogeneous and uniform coating over the entire substrate area, either the films are amorphous or crystalline.

Once the films are processed with the desired thickness(es),matching layers and desired device structures, these can be annealed at temperatures in the range from 60° C. to 300° C., using times that can vary between 50 minutes to six hours, function of the substrate and desired application, an atmosphere that may contain oxygen, nitrogen or a mixture of nitrogen and hydrogen, or oxygen and nitrogen, or nitrogen and fluoride or a mixture of oxygen, hydrogen and nitrogen in proportions that can vary between 0.1:99.9 and 0.1:0.1:9.8 of the gas composition previously mentioned and performed at atmospheric pressure or under vacuum ($10^{-2}$ Pa to 1000 Pa).

DESCRIPTION OF THE PREFERRED REPRESENTATION OF THE INVENTION

Example of the preparation of one electronic device that contains the elements/components claimed in this patent, namely $OCu_xNi_y$, the GSZTCO, the $Ta_xO_y$ and the encapsulating layer based on $MgF_x$.

The present patent aims to give an example of the production of an active device such as an unipolar transistor, a p-n heterojunctions, or a logic gate, using the components claimed in this patent, namely the $OCu_xNi_y$ to be used preferentially as a p-type semiconductor, the GSZTCO as a n-type semiconductor; the $MgF_x$ as one encapsulating material, and the $Ta_xO_y$ as a matching layer between two semiconductors or a semiconductor ad a dielectric or the semiconductor and the encapsulating layer, using one or any combinations of the fabrication processes already described for the production of materials in which the devices are based, besides other materials and substrates required for the final device, either in the amorphous or crystalline forms or the combination of both to be used in electronic and optoelectronic applications, showing a thickness ranging from 0.1 nm to 1000 nm, processed at temperatures below 100° C., using in its process the direct lithography patterning or the 'lift-off' technique.

a) Production of TFT

To manufacture a n-type TFT working in the depletion (current on without applied voltage) or enhancement modes (current off without voltage applied), the first operation consists in selecting the type of substrate to be used that can be either a glass, a polymer, a metal or a cellulosic paper, followed by the selection of the type of configuration and geometry of the device components, which are the locations of the gate electrode that should be a good conductor; the dielectric that should be a material exhibiting a high resistivity (higher than $10^{15}$ Ω.cm) and with the required band gap to lead to the required of voltage with the active channel layer; the matching layer between the dielectric and the channel layer based on GSZTCO, containing or not other impurities, for a n-type TFT or on $OCu_xNi_y$, containing or not other impurities, for a p-type TFT, working as an active semiconductor, (resistivity higher than 10 Ω.cm and smaller than $10^8$ Ω.cm); the electrical symmetric drain and source region, that is, with equal composition and performances, constituted by $OCu_xNi_y$ or GSZTCO of low resistivity (below $10^{-2}$ Ω.cm), respectively, to be used upon the p-type and the n-type semiconductors, in order to guarantee a good ohmic contact or a metallic material such as titanium, gold or another highly-conductive oxide such as the ZGO or the IZO, in their amorphous or crystalline forms, followed by the physical connection to the external electrodes or to other devices (matrix form where each TFT constitute a pixel where the number of TFT required is above or of the order of $10^7$), using conventional processes such as soldering or conductive glue and involving adequate lithography steps, followed or not by one annealing step in a controlled or non-controlled atmosphere.

The selection process of the geometry and configuration of the final device (see FIGS. 3, 4 and 5), consists in knowing if the gate electrode is deposited on the substrate, constituting the first fabrication step of the device or if its deposit as the last step, being the first configuration designated as bottom gate and the second one as top gate or if the drain and source regions are deposited before or after the channel layer, designated respectively as inverted or staggered and finally if we have to use an asymmetric structure as shown in FIGS. 5, (4), (6) and (7), to guarantee an effective intense electrical field associated to the source region, thus improving, or not, the electrical stability of the devices.

Whatever the configuration selected, (see FIGS. 3 to 5), the different TFT components are subject to be encapsulated by means of a removal lithographic or 'lift-off' technique, meaning the deposition of a highly resistant, compact but soluble resin with a proper solvent, adequately cured to temperatures below 80° C., to eliminate volatile elements in the resin, with the desired design and dimensions of gate electrode opening upon which the electrode will be deposited (designated as mask) and which is then soluble in a revealing chemical solution, allowing the resin removal as well as the material deposited, except for the areas in which the resin is not present.

On the specific case in which a substrate glass is selected, and being afterwards the gate electrode deposited, see FIG. 3 (2), using a conductive oxide such as ITO or IZO or a metal, such as gold, using for instance the lift-off technique (mask #1), with the desired geometry and a well-defined separation between electrodes, as well as their connection to the pad contacts, including also the allowable tolerances, processed at temperatures below 100° C.

After depositing the gate electrode, it follows the deposition of the dielectric material with the adequate thickness, in the range from 10 nm to 2000 nm, see FIG. 3, (3), using an inorganic material such as silicon dioxide or silicon nitride or an organic material such as Mylar or another single or multi-stacked structures as for instance tantalum oxide, hafnia, zirconia, ytria, alumina, or composites of hafnia/tantalum oxide, alumina/tantalum oxide, hafnia/alumina; silicon dioxide/tantalum pentoxide, tantalum oxide/Ytria; zirconiatantalumm pentoxide /silicon dioxide, Alumina/titanium oxide or PMMA, or POMA, or Mylar, at temperatures below 100° C., where the layer deposited should also be highly compact to reduce leakage of current as much as possible, with the desired work function to get the required off-voltage, when connected by direct deposition to the channel layer, that can be amorphous or crystalline, but showing a surface as smooth as possible, followed by the definition of its geometry and configuration, using a standard lithographic process, as already described, or a lift-off technique. In the present example, the deposition over the dielectric of a positive photo-resist (resin) will now protect the regions that will not be removed and the others, to be selective removed and exposed by the developer to the wet or dry etching agent, that is, the dielectric material is removed from the non-protected regions, without removing the conductive electrode that normally has dimensions larger than that of the gate dielectric (mask #2).

Once the dielectric deposited, the deposition of the matching $Ta_xO_y$ layer is followed, see FIG. 3, (4), with a thicknesses from 0.5 nm to 1000 nm, depending its surface geometry from the one selected for the dielectric, with a size tolerance below 0.15% of the previous selected dimensions, function of the dielectric used, using the same mask as before.

Afterwards, the deposition of the channel layer is followed, comprising $OCu_xNi_y$ or GSZTCO, respectively for p-and n-type TFT, see FIG. 3, (5), with or without impurities incorporated and whose mask size is slightly smaller than the previous one (dielectric), having channel lengths that may vary between 10 nm to $10^5$ nm and widths that vary between 10 nm to $10^6$ nm, with channel thicknesses that vary in the range of 1 nm to 10000 nm, function of the envisaged application, respectively in the nano-electronics, or microelectronics fields or other, processed at temperatures below 100° C., and where the final geometry is obtained either by using the 'lift-off' technique, or direct electron writing on the substrate technique or the conventional lithography process (mask #3) followed by the etching process as described above for the dielectric layer, but now using different chemical etchings and times of process that allow the aimed selectivity, that is to etch the channel material in defined non-protected regions without affecting the dielectric or matching layers, followed or not by an annealing treatment at temperatures between 60° C. to 350° C., function of the envisaged application and substrate material selected, in a controlled or not controlled atmosphere.

Once the dielectric deposited and the channel geometry defined, the deposition of the drain and source regions take place, using the most adequate fabrication tolerances, compatible with the developing systems used, which can be respectively $OCu_xNi_y$ and GSZTCO highly conductive (conductivities above $10^2$ S.cm$^{-1}$), respectively for the p- and n-type TFT or a generated oxide such as IZO, ZGO or a metal such as titanium or gold or chromium, see FIG. 3, (6) e (7).

The geometry of the drain and source regions , see FIGS. 3 to 5 , (6) and (7) and corresponding metal pad contacts to the external connections, whose width is a function of that one established for the channel layer and can have dimensions that can vary between $3\times10$ nm to $3\times10^6$ nm in size and whose final design (mask #4) is obtaining either by using the 'lift-off', or direct electron writing on the substrate technique or the conventional lithography process, followed by the etching process as described for the channel layer, but now using different etching and times of process that allow the aimed selectivity that is, to etch the drain and source materials in defined non-protected regions without affecting the channel and the dielectric or matching layers, followed or not by an annealing treatment at temperatures between 60° C. to 350° C., function of the envisaged application and substrate material selected, in a in a controlled or not controlled atmosphere.

Once the TFT deposited with the pre-defined structures, its encapsulating takes place, with or without using again a matching layer, which consists in depositing a $MgF_x$, layer with a thickness between 1 nm to 1000 nm, see FIG. 3, (9), using one of the techniques already described to deposit this material, where in normal situations the films deposited have thicknesses in the range of 100-300 nm, leaving the needed windows open thus allowing to perform the needed connections to the metal pad contacts, (mask # 5), by means of a lithographic technique such as the 'lift-off', followed or not by an annealing treatment in controlled atmosphere, at temperatures up to 350° C., for times that can vary between 50 minutes and six hours, function of the substrate used.

In the case where the annealed treatment is performed either to the layers, structured or to the final device, the controlled atmosphere might contain an inert gas such as 95% nitrogen with 5% hydrogen, or an argon atmosphere, or a reactive gas like oxygen, hydrogen or fluor.

Besides the configurations already described, where the first step consists in the deposition of the gate electrode, the other configuration starts with the depositing of the drain and source regions using a conventional or lift-off lithographic process, followed by the deposition of the channel region that will overlap the previous ones at the edges, see FIG. 4, followed by the deposition of the matching layer and of the dielectric , separately or individually configured by lithography, being followed by the deposition of the electrode gate and finally the encapsulating step, with the required opened windows to allow the connections to the pad contacts of the gate, drain and source regions.

As previously described, the above-mentioned step is followed by annealing procedures.

FIGS. 12 and 13 represent respectively the output and the transfer characteristics recorded on a typical n-type TFT based on GSZTCO, with the proportions 1:2:2:0.02:0.01, working in enhancement mode.

b) Processing of a p-n Heterojunction

When processing heterojunctions, these can be manufactured with two different types of material, such as n-type GSTZO of low resistivity, see FIG. 14, (5) with a 300-500 nm thickness, followed by the deposition of a thinner matching layer of $Ta_xO_y$ with a thickness inferior to 1 nm, see FIG. 14 (4), followed by the deposition of the p-type $OCu_xNi_y$ layer, see FIG. 14, (10), with a 10-20 nm thickness, in order to obtain the required rectifying diode effect, followed, or not, by an annealing treatment as already described before, and whose final device design is in-line with the expected application, using the same type of fabrication lithographic steps as already described.

c) Processing an Inverter Logic Gate

The example given consists in using two TFT, one n-type working in the enhancement mode as shown in FIGS. 1 and 2, (12) and a p-type, working in the enhancement or depletion mode and behaving as a dynamic load of the first TFT (driver), whose fabrication process corresponds to the one already described concerning a C-MOS device.

One should stress the fact that the examples given do not correspond to all possible device applications, just illustrating practical examples of the patent applications for a clear understanding of the contents of the invention. Variations and alterations might be applied without deviating the contents described in the present patent. Such modifications and variations must be included in the present document and protected by the following claims.

BIBLIOGRAPHY

T. Minami et al. Semicond. Sci. Technol. 20 (2005) S35-S44.

H. L. Hartnagel, A. L. Dawar, A. K. Jain, C. Jagadish, Semiconducting Transparent Thin Films, Institute of Physics Publ., Bristol 1995.

E. Fortunato, et al, Thin Solid Films, 442 (2003) 121-126.

E. Fortunato, et al., Thin Solid Films, 451-452 (2004) 443-447.

H. Hosono et al. J. Non-Cryst. 203, 334 (1996).

H Hosono, J Non-Cryst Solids 351, 1-19 (2006); K. Nomura, et al. Nature, 432 (2004) 488.

J. F. Wager, Science, 300 (2003) 1245.

E. Fortunato et al. pss, rapid research letters, 1, (2007), R34.; E. Fortunato, et al.

Advanced Materials, 17, 5, (2005) 590.

R. Martins et al. J. Non-Cryst. Solids, Vol. 352, 1471 (2006) ; R. Martins et al.

Phys. stat. sol. (a) 202, No. 9, R95 (2005).

Hideo Hosono, Toshio Kamyia, Masahiro Hirano, Bulletin of the chemical Society of Japan, 77, 1 (2006) 1-24.

H. Hosono, Y. Mishima, H. Takezoe, K. J. D. Mackenzie in 'Nanomaterials',

Elsevier, Tokyo, Novembro 2006.

D. Hong , H. Q. Chiang, J. F. Wager, Zinc tin oxide thin-film transistors via reactive sputtering using a metal target , Journal of Vacuum Science & Technology B 24 (5) L23 (2006).

T. Kamiya T (Kamiya, Y. Takeda, K. Nomura, H. Ohta, H. Yanagi, M. Hirano, H.

Hosono, Self-adjusted, three-dimensional lattice-matched buffer layer for growing ZnO epitaxial film: Homologous series layered oxide, $InGaO_3(ZnO)(_5)$, Crystal Growth & design 6 (11) 2451 (2006).

T. Feng, A. K. Ghosh, C. Fishman, Appl. Phys. 50 (1979) 4972.

J. B. DuBow, D. E. Burk, APL. 29 (1976) 494.

H. Kobayashi, H. Mori, T. Ishida, Y. Nakato, J. Appl. Phys. 77 (1995) 1301.

M. T aguchi, K. Kawamoto, S. Tsuge, T.Baba, H. Sakata, M. Morizane,

K. Uchihashi, N. Nakamura, S. Kiyama, O. Oota, Prog. Photovolt. Res. Appl. 8 (2000) 503.

The invention claimed is:

1. An electronic semiconductor, comprising:
a multi-component copper and nickel oxide represented by $OCu_xNi_y$ in at least one of a non-stoichiometric or a stoichiometric form, and a multi-component Gallium-Tin-Zinc-Titanium-Copper oxide represented by GSZ-TCO in at least one of a non-stoichiometric or a stoichiometric form, the $OCu_xNi_y$ and the GSZTCO used as active p-type and n-type oxides, with or without doping:
wherein the $OCu_xNi_y$ and the GSZTCO are at least one of an amorphous structure and a crystalline structure and an amount of each element that composes the $OCu_xNi_y$ and the GSZTCO varies in a range of 0.005 to 0.995 of a total molar composition of each of the $OCu_xNi_y$ and the GSZTCO; and
wherein an electronic functionality and an optical functionality of the semiconductor device are controlled by at least one of the amount of each element and by an addition of other impurities including at least one of a zirconium and a nitrogen in amounts up to 0.20 of a total composition of the oxides.

2. The electronic semiconductor device according to claim 1, wherein the semiconductor device is configured as at least one of a CMOS device, a thin film transistor and a heterojunctions logic gate.

3. The electronic semiconductor device according to claim 1 wherein the device is a passive electronic material selected from the group consisting of ohmic contacts; and active p-type and n-type semiconductor material in an electronic and optoelectronic device.

4. The electronic semiconductor device according to claim 1 wherein the $OCu_xNi_y$ is processed at temperatures below 100° C., and under an influence of an ultra-violet light radiation and ozone, using thicknesses in a range of 10-10000 nm.

5. The electronic semiconductor device according to claim 1, wherein the GSZTCO is processed at temperatures below 100° C., with or without presence of an ultra violet light radiation, using thicknesses in a range of 10-10000 nm.

6. The electronic-semiconductor device, according to claim 1, wherein the oxides are processed in any type of substrate from the group consisting of a metal substrate, a glass substrate, a polymer substrate, and a cellulosic paper substrate, the oxides being processed at temperatures below 100° C., while highly compact and with electrical conductivities controlled from $10^{-14}$ S. $cm^{-1}$ to $10^5$ S. $cm^{-1}$.

7. The electronic semiconductor device according to claim 1, wherein the oxides are processed by a physical, a physical-chemical, or a chemical technique, using vacuum based technologies, the vacuum based technologies including at least one of a thermal evaporation, a dc sputtering, an rf sputtering, and an ink-jet, in order to manufacture amorphous or crystalline films with composition controlled at growth rates in a range of $0.01\,\text{nms}^{-1}$ to $20\,\text{nms}^{-1}$ and process pressures in a range of $10^5$ Pa to $10^{-6}$ Pa.

8. The electronic semiconductor device according to claim 1, wherein after fabrication of the semiconductor device, the semiconductor device is reheated in a controlled post-manufactured atmosphere at temperatures in a range of 50° C. to 250° C. and for times in a range of 50 minutes to 6 hours.

9. The electronic semiconductor device according to claim 8, wherein the semiconductor device has layer thickness in a range of 0.5 nm to 1000 nm when configured as channel layer material for nano-electronics and microelectronic applications.

10. The electronic semiconductor device according to claim 1, wherein the $OCu_xNi_y$ p-type and the GSZTCO n-type are configured as a high conductivity electrode when in passive form, and configured for production of p-n heterojunctions when in active form.

11. The electronic semiconductor device according to claim 1, wherein the $OCu_xNi_y$ p-type oxide and the GSZTCO n-type oxide are configured for being used as blocking electronic or hole layers when the oxides' conductivities are below $10^{-6}\,\text{S.cm}^{-1}$.

12. The electronic semiconductor device according to claim 6, further comprising a matching layer from a semiconductor active oxide to a dielectric, a silicon dioxide, a silicon nitride, or a tantalum pentoxide, the matching layer having thicknesses in a range of 1 nm to 1000 nm.

13. The electronic semiconductor device according to claim 6, further comprising an encapsulating layer based on a magnesium fluoride stoichiometric or a magnesium fluoride non-stoichiometric with thicknesses in a range of 10 nm to 1000 nm.

14. The electronic semiconductor device according to claim 1, wherein the device is configured for use in conception of at least one of passive and active $OCu_xNi_y$ and GSZ-TCO semiconductors, and the device being configured to manufacture p-n devices, C-MOS devices, logic gates, sensor instruments, or biodetectors instruments.

15. The electronic semiconductor device according to claim 14, wherein manufacturing the semiconductor device takes place at temperatures below 100° C., with or without a presence of an ultra violet light to assist a deposition process.

* * * * *